US011515688B2

(12) United States Patent
Fimland et al.

(10) Patent No.: US 11,515,688 B2
(45) Date of Patent: Nov. 29, 2022

(54) LASERS OR LEDS BASED ON NANOWIRES GROWN ON GRAPHENE TYPE SUBSTRATES

(71) Applicant: NORWEGIAN UNIVERSITY OF SCIENCE AND TECHNOLOGY, Trondheim (NO)

(72) Inventors: Bjorn Ove Myking Fimland, Trondheim (NO); Helge Weman, Ecublens (CH); Dingding Ren, Trondheim (NO)

(73) Assignee: Norwegian University of Science and Technology, Trondheim (NO)

( * ) Notice: Subject to any disclaimer, the term of this patent is extended or adjusted under 35 U.S.C. 154(b) by 0 days.

(21) Appl. No.: 16/482,915

(22) PCT Filed: Feb. 5, 2018

(86) PCT No.: PCT/EP2018/052836
§ 371 (c)(1),
(2) Date: Aug. 1, 2019

(87) PCT Pub. No.: WO2018/141974
PCT Pub. Date: Aug. 9, 2018

(65) Prior Publication Data
US 2019/0355868 A1    Nov. 21, 2019

(30) Foreign Application Priority Data
Feb. 3, 2017    (GB) .................................... 1701829

(51) Int. Cl.
H01L 33/06    (2010.01)
H01L 33/00    (2010.01)
(Continued)

(52) U.S. Cl.
CPC ...... *H01S 5/34333* (2013.01); *H01L 29/0676* (2013.01); *H01L 33/0025* (2013.01);
(Continued)

(58) Field of Classification Search
CPC .... H01S 5/183; H01S 5/34333; H01S 5/0025; H01S 5/343; H01S 5/00; H01S 5/2228;
(Continued)

(56) References Cited

U.S. PATENT DOCUMENTS

2004/0095658 A1*    5/2004    Buretea ................. C03C 14/006
                                                          359/853
2006/0056463 A1*    3/2006    Wang ........................ G01J 3/10
                                                          372/3
(Continued)

FOREIGN PATENT DOCUMENTS

JP    2012222001 A    11/2012
WO    2008048704 A2    4/2008
(Continued)

OTHER PUBLICATIONS

International Search Report and Written Opinion for PCT/EP2018/052836 dated Jun. 22, 2018 (14pp).

*Primary Examiner* — Lawrence C Tynes, Jr.
(74) *Attorney, Agent, or Firm* — Thomas Horstemeyer, LLP

(57) ABSTRACT

A device, such as a light-emitting device, e.g. a laser device, comprising: a plurality of group III-V semiconductor NWs grown on one side of a graphitic substrate, preferably through the holes of an optional hole-patterned mask on said graphitic substrate; a first distributed Bragg reflector or metal mirror positioned substantially parallel to said graphitic substrate and positioned on the opposite side of said graphitic substrate to said NWs; optionally a second distributed Bragg reflector or metal mirror in contact with the top
(Continued)

of at least a portion of said NWs; and wherein said NWs comprise aim-type doped region and a p-type doped region and optionally an intrinsic region there between.

22 Claims, 8 Drawing Sheets

(51) Int. Cl.
*H01L 33/32* (2010.01)
*H01L 33/60* (2010.01)
*H01S 5/343* (2006.01)
*H01S 5/02* (2006.01)
*H01S 5/183* (2006.01)
*H01S 5/22* (2006.01)
*H01S 5/042* (2006.01)
*H01L 29/06* (2006.01)

(52) U.S. Cl.
CPC .............. *H01L 33/06* (2013.01); *H01L 33/32* (2013.01); *H01L 33/60* (2013.01); *H01S 5/0218* (2013.01); *H01S 5/04253* (2019.08); *H01S 5/18361* (2013.01); *H01S 5/2228* (2013.01); *H01S 5/343* (2013.01)

(58) Field of Classification Search
CPC .... H01S 5/341; H01S 5/0218; H01S 5/18361; H01L 29/0676; H01L 29/66977; H01L 33/10; H01L 33/465; H01L 33/0066; H01L 33/60; H01L 33/46–465; H01L 51/5265; H01L 51/5271; H01L 21/02538; H01L 21/02603
See application file for complete search history.

(56) References Cited

U.S. PATENT DOCUMENTS

| | | |
|---|---|---|
| 2006/0098705 A1 | 5/2006 | Wang |
| 2011/0254034 A1 | 10/2011 | Konsek et al. |
| 2012/0037886 A1* | 2/2012 | Hsu .................. H01L 33/58 257/13 |
| 2012/0141799 A1* | 6/2012 | Kub ................. H01L 31/03923 977/734 |
| 2012/0205613 A1* | 8/2012 | Mi ...................... H01L 29/775 257/E21.09 |
| 2013/0221322 A1* | 8/2013 | Ohlsson ............. H01L 29/0684 257/13 |
| 2013/0240348 A1* | 9/2013 | Mi ............................ C25B 1/55 204/157.4 |
| 2015/0076450 A1* | 3/2015 | Weman .................. H01L 33/24 257/29 |
| 2015/0141268 A1* | 5/2015 | Rothberg ........... G01N 21/7743 506/2 |
| 2015/0233551 A1* | 8/2015 | Cho .................. H01L 25/0753 29/840 |
| 2019/0189840 A1* | 6/2019 | Tsai .................... H01L 33/0075 |

FOREIGN PATENT DOCUMENTS

| | | |
|---|---|---|
| WO | 2011162715 | 12/2011 |
| WO | 2012080252 | 12/2011 |
| WO | 2013104723 | 7/2013 |
| WO | 2013128540 A | 9/2013 |
| WO | 2013190128 | 12/2013 |
| WO | 2014202796 | 6/2014 |
| WO | 2017009394 | 7/2016 |
| WO | 2017009395 | 7/2016 |
| WO | 2017021380 | 8/2016 |

* cited by examiner

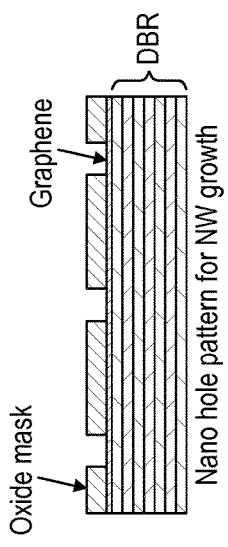
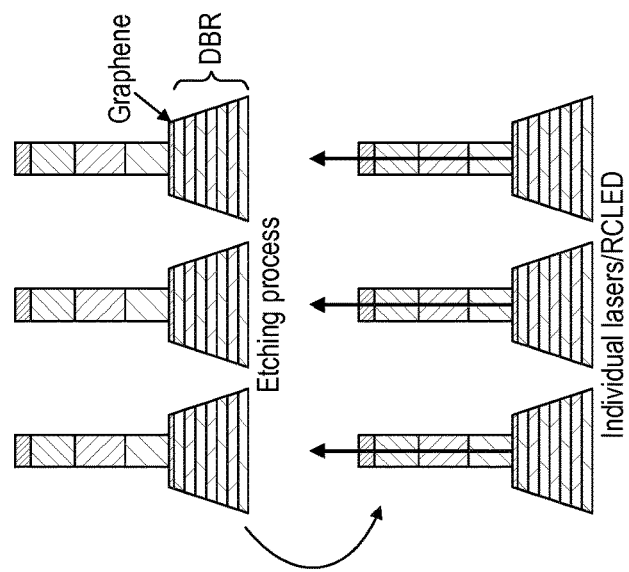
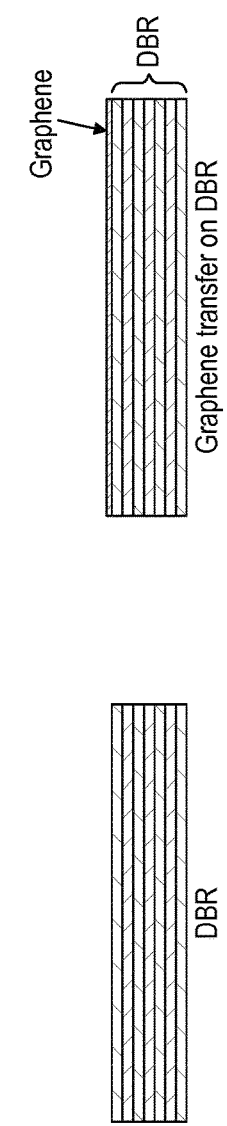
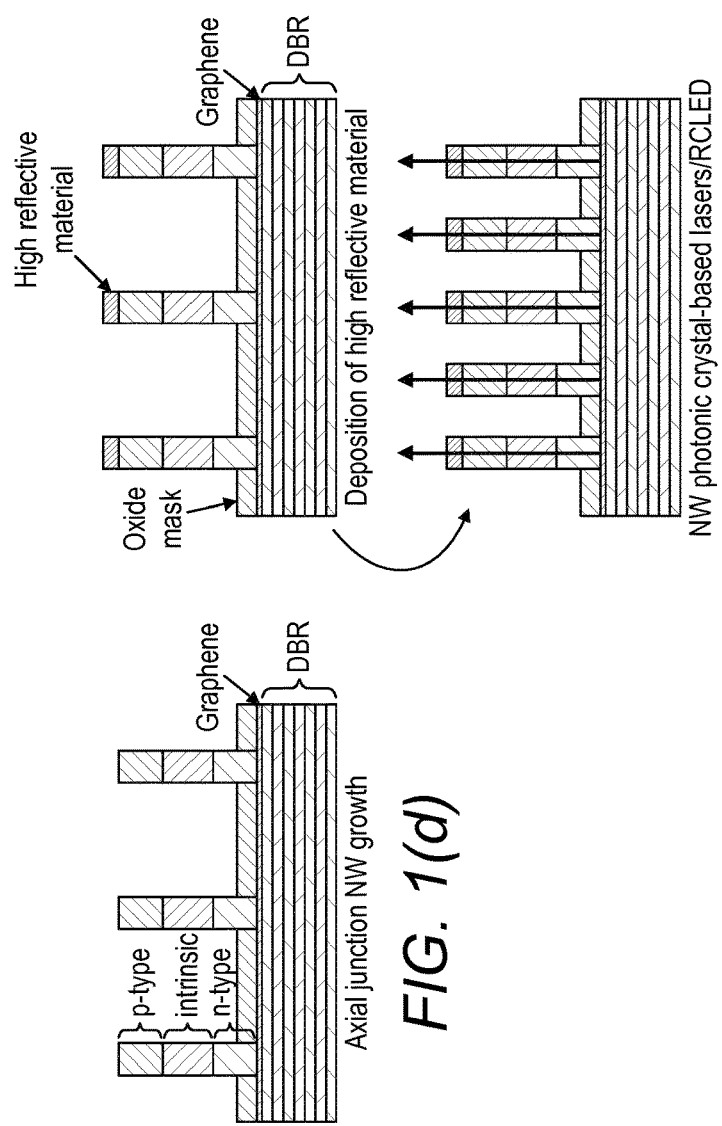

LASERS OR LEDS BASED ON NANOWIRES GROWN ON GRAPHENE TYPE SUBSTRATES

This invention concerns the use of a thin graphitic layer as a transparent substrate for the growth of nanowires (NWs) which can be formed into devices such as vertical cavity surface emitting lasers (VCSELs) or resonant cavity light emitting diodes (RCLEDs).

In particular, the invention relates to the use of group III-V semiconductor NWs on graphitic substrates that comprise suitable doping and may comprise quantum heterostructures like quantum wells, quantum dots, or superlattices that are positioned between two distributed Bragg reflectors or metal mirrors in order to allow the formation of a VCSEL or RCLED.

BACKGROUND

Over recent years, interest in semiconductor nano crystals (such as NWs) has intensified as nanotechnology becomes an important engineering discipline. NWs, which are also referred to as nanowhiskers, nanorods, nanopillars, nanocolumns, etc. by some authors, have found important applications in a variety of electrical devices such as sensors, solar cells, and light emitting diodes (LEDs).

The present invention concerns VCSELs based on NWs grown on graphitic substrates or RCLEDs based on the same technology but operating below the lasing threshold.

A laser is a device that emits light through a process of optical amplification based on the stimulated emission of electromagnetic radiation. The term "laser" originated as an acronym for "light amplification by stimulated emission of radiation". A laser differs from other sources of light in that it emits light coherently. Spatial coherence allows a laser to be focused to a tight spot, enabling applications such as laser cutting and lithography. Spatial coherence also allows a laser beam to stay narrow over great distances (collimation), enabling applications such as laser pointers. Lasers can also have high temporal coherence, which allows them to emit light with a very narrow spectrum, i.e., they can emit a single color of light.

Among their many applications, lasers are used in optical disk drives, laser printers, and barcode scanners; DNA sequencing instruments, fiber-optic and free-space optical communication; laser surgery and skin treatments; cutting and welding materials; military and law enforcement devices for marking targets and measuring range and speed; and laser lighting displays in entertainment.

The present invention relates, inter alia, to nanolasers and nano-LEDs. Nanolasers and nano-LEDs will enable the development of new science and technologies, such as localized laser cooling, displays, energy-efficient solid state lighting, wearable optoelectronics, medical devices and laser printers. However, the lack of flexibility for integration of nano lasers into other advanced optoelectronic platforms hinders the further development of nano laser-based research and applications, such as in nanophotonics/optoelectronics, condensed matter physics and other applied disciplines.

Typically, NWs have a width of the order of hundreds of nanometres or less (e.g. 500 nm-50 nm), and an aspect ratio (length-to-width ratio) of 10 or more. Given these typical dimensions, NWs are often considered to have a one-dimensional (1D) anisotropic geometry.

The dimensions of a NW may also confine light within the NW in two lateral dimensions since the nanowire diameter is symmetric. The optical confinement occurs due to the width of the NW, and the refractive index contrast between the NW and surrounding material (e.g. air or a filler). The optical confinement enables light to be guided along the length of the NW.

The present inventors appreciate that with its one dimensional (1D) anisotropic geometry, the NW structure itself may work as both (i) a Fabry-Pérot optical cavity (e.g. in which laser/RCLED light may circulate), and (ii) a gain medium that is suitable for amplifying laser/RCLED light and which has strong carrier and optical confinement, and an enhanced electronic density of states. With these properties, the inventors have appreciated that a nanolaser and a nano-LED may be formed with the NW structure. Such nanolasers and nano-LEDs based on the NW structure may be broadly referred to as a NW laser and NW LEDs, respectively. It is expected to be more efficient in performance and much smaller in dimension than other laser sources. By modulating the material structure and/or composition within the NW, the length, and the width (e.g. diameter) of the NW, the optical modes supported inside the NW cavity may be tuned flexibly.

Especially, direct bandgap III-V semiconductor NW lasers have attracted great attention recently, as the material itself is the most promising for realising lasers with high performance, covering materials from infra-red (e.g. GaSb, InAs, GaAs), visible (e.g. GaAsP, InGaN) to ultraviolet (e.g. AlGaN, AlN). The high refractive index difference of III-V materials with air can ensure the effective optical confinement of the light inside the NW cavity, bringing about stable room temperature lasing behaviour. Incorporation of zero dimensional (0D) quantum dot (QD) structures composed of low bandgap materials inside the NW, for example InGaN QDs in GaN NWs, is an efficient method to restrain the electrons and holes in a delta-function-like density of states, leading to low lasing threshold, high temperature stability and quality factor.

Thus, it will be appreciated that NW lasers and NW LEDs may provide many desirable characteristics. However, to date, making such NW lasers and NW LEDS, in particular NW VCSELs and NW RCLEDs, remains difficult and there are several critical scientific and practical challenges still to be solved. Some of these challenges are listed below and there is a need to address these challenges, particularly to fabricate arrays of NW VCSEL/RCLEDs (which is desirable to induce optical coupling between neighbouring NW VCSELs/RCLEDs for making light emitting NW photonic crystal (PC) arrays):

1. Difficulty of monolithic integration. It is challenging to grow vertical III-V NW lasers epitaxially on a distributed Bragg reflector (DBR) or metal mirrors. For example, GaAs based NWs are epitaxially grown in the [111] direction, which is not compatible with two dimensional (2D) GaAs/AlAs DBRs that are grown on GaAs(100).
2. It is difficult to make an electrically pumped laser since many DBR materials suitable as mirrors have low conduction or are even insulating.
3. Absorbing electrical contact. For example, UV light will be absorbed a lot by traditional transparent ITO contacts, which dramatically reduces the laser performance.

The present inventors propose NW VCSELs or NW RCLEDs involving the growth of NWs on graphitic substrates such as graphene. In particular, the inventors consider growing group III-V NWs such as GaAs, GaN, AlN, InGaN, AlGaN, and AlInGaN NWs on graphene. In this way, the inventors advantageously use graphene both as a substrate as well as transparent and conductive contact to the NW VCSELs/RCLEDs. The inventors have also appreciated that, due to the transparency of graphene across all interesting electromagnetic light wavelengths, graphene can be used as a bottom support for NW based light-emitting devices, without blocking the light path from the NWs to structures that may be placed beneath the graphene (e.g. without blocking the light path to an underlying DBR).

The growth of NWs on graphene is not new, per se. In WO2012/080252, there is a discussion of the growth of semiconductor NWs on graphene substrates using molecular beam epitaxy (MBE). WO2013/104723 concerns improvements on the '252 disclosure in which a graphene top contact is employed on NWs grown on graphene. These previous documents are not, however, concerned with lasers or LEDs. More recently, the inventors have described core-shell NWs grown on graphene (WO2013/190128).

US 2011/0254034 describes nanostructured LEDs emitting in the visible region. The device comprises a nanostructured LED with a group of NWs protruding from a substrate. The NWs have a p-i-n junction and a top portion of each NW is covered with a light-reflective contact layer which may also act as an electrode. When a voltage is applied between the electrode and the light-reflective contact layer, light is generated within the NW.

No one before, however, has considered lasers or LEDs based on NWs (i.e. NW lasers/LEDs) grown on graphene type substrates.

SUMMARY OF INVENTION

Thus, viewed from one aspect, the invention provides a device, such as a light-emitting device, e.g. a laser device, comprising:

a plurality of group III-V semiconductor NWs grown on one side of a graphitic substrate, preferably through the holes of an optional hole-patterned mask on said graphitic substrate;

a first distributed Bragg reflector or metal mirror positioned substantially parallel to said graphitic substrate and positioned on the opposite side of said graphitic substrate to said NWs;

optionally a second distributed Bragg reflector or metal mirror in contact with the top of at least a portion of said NWs;

and wherein said NWs comprise an n-type doped region and a p-type doped region and optionally an intrinsic region there between.

Viewed from another aspect the invention provides a device, such as a light-emitting device, e.g. a laser device, comprising:

a plurality of group III-V semiconductor NWs grown on one side of a graphitic substrate, preferably through the holes of an optional hole-patterned mask on said graphitic substrate;

a first distributed Bragg reflector or metal mirror positioned substantially parallel to said graphitic substrate and positioned on the opposite side of said graphitic substrate to said NWs;

optionally a second distributed Bragg reflector or metal mirror in contact with the top of at least a portion of said NWs;

and wherein said NWs comprise an n-type doped region and a p-type doped region and optionally an intrinsic region there between;

wherein at least one of said regions comprises at least one heterostructure; and optionally at least one of said regions comprises an electron or hole blocking layer.

Viewed from another aspect the invention provides a device, such as a laser device, comprising:

a plurality of group III-V semiconductor NWs grown on one side of a graphitic substrate, preferably through the holes of an optional hole-patterned mask on said graphitic substrate;

a transparent spacer layer substantially parallel to and in contact with the opposite side of said graphitic substrate;

a first distributed Bragg reflector or metal mirror substantially parallel to and in contact with the transparent spacer layer;

optionally a second distributed Bragg reflector or metal mirror in contact with the top of at least a portion of said NWs;

and wherein said NWs comprise an n-type doped region and a p-type doped region and optionally an intrinsic region there between.

Viewed from another aspect the invention provides a device, such as a light-emitting device, e.g. a laser device, comprising:

a plurality of group III-V semiconductor NWs grown on one side of a graphitic substrate, preferably through the holes of an optional hole-patterned mask on said graphitic substrate;

a first distributed Bragg reflector or metal mirror positioned substantially parallel to said graphitic substrate and positioned on the opposite side of said graphitic substrate to said NWs;

optionally a second distributed Bragg reflector or metal mirror in contact with the top of at least a portion of said NWs;

and wherein said NWs comprise at least one heterostructure; and optionally at least one of said NWs comprises an electron or hole blocking layer.

Viewed from another aspect the invention provides a device, such as a light-emitting device, e.g. a laser device, comprising:

a plurality of group III-V semiconductor NWs grown on one side of a graphitic substrate, preferably through the holes of an optional hole-patterned mask on said graphitic substrate;

a transparent spacer layer substantially parallel to and in contact with the opposite side of said graphitic substrate;

a first distributed Bragg reflector or metal mirror positioned substantially parallel to said graphitic substrate and positioned on the opposite side of said graphitic substrate to said NWs;

optionally a second distributed Bragg reflector or metal mirror in contact with the top of at least a portion of said NWs;

and wherein said NWs comprise at least one heterostructure, preferably selected from a quantum well, a quantum dot, or a superlattice; and optionally at least one of said NWs comprises an electron or hole blocking layer.

Viewed from another aspect the invention provides a device, such as a light-emitting device, e.g. a laser device, comprising:

a plurality of group III-V semiconductor NWs grown on one side of a graphitic substrate, preferably through the holes of an optional hole-patterned mask on said graphitic substrate;

a first distributed Bragg reflector or metal mirror in contact with the top of at least a portion of said NWs;

optionally a second distributed Bragg reflector or metal mirror positioned substantially parallel to said graphitic substrate and positioned on the opposite side of said graphitic substrate to said NWs;

and wherein said NWs comprise an n-type doped region and a p-type doped region and optionally an intrinsic region there between.

Viewed from another aspect the invention provides a device, such as a light-emitting device, e.g. a laser device, comprising:

a plurality of group III-V semiconductor NWs grown on one side of a graphitic substrate, preferably through the holes of an optional hole-patterned mask on said graphitic substrate;

a first distributed Bragg reflector or metal mirror in contact with the top of at least a portion of said NWs;

optionally a second distributed Bragg reflector or metal mirror positioned substantially parallel to said graphitic substrate and positioned on the opposite side of said graphitic substrate to said NWs;

and wherein said NWs comprise at least one heterostructure; and optionally at least one of said NWs comprises an electron or hole blocking layer.

Preferably said intrinsic region (active region) is present and preferably it comprises at least one heterostructure selected from a quantum well, a quantum dot, or a superlattice.

Where the device emits light, the light is preferably emitted (lased) in a direction substantially parallel to and in the same direction as the growth direction of the NWs. The distributed Bragg reflectors or metal mirrors are preferably parallel with the graphitic substrate.

Viewed from another aspect, the invention provides a laser device comprising:

a plurality of NWs grown on one side of a graphitic substrate, preferably through the holes of an optional hole-patterned mask on said graphitic substrate;

a first distributed Bragg reflector or metal mirror positioned substantially parallel to said graphitic substrate and positioned on the opposite side to said NWs;

optionally a second distributed Bragg reflector or metal mirror in electrical contact with the top of at least a portion of said NWs;

and wherein said NWs comprise an n-type doped region and a p-type doped region separated by an intrinsic region (active region) wherein said intrinsic region comprises a plurality of quantum heterostructures selected from quantum wells, quantum dots or superlattices; and optionally at least one of said regions comprises an electron blocking layer.

Viewed from another aspect the invention provides a process for the preparation of a device as hereinbefore defined comprising providing a graphitic substrate having a first distributed Bragg reflector or metal mirror substantially parallel to and on one side of said graphitic substrate;

growing a plurality of group III-V semiconductor NWs epitaxially on said graphitic substrate opposite to said DBR or metal mirror, preferably through the holes of a hole-patterned mask on said graphitic substrate, said NWs comprising an n-type doped region and a p-type doped region optionally separated by an intrinsic region (active region); and optionally providing a second distributed Bragg reflector or metal mirror in contact with the top of at least a portion of said NWs.

It is preferred if the intrinsic region is present.

Viewed from another aspect the invention provides a process for the preparation of a device comprising providing a graphitic substrate having a first distributed Bragg reflector or metal mirror substantially parallel to and on one side of said graphitic substrate;

growing a plurality of group III-V semiconductor NWs epitaxially on said graphitic substrate opposite to said DBR or metal mirror, preferably through the holes of a hole-patterned mask on said graphitic substrate, said NWs comprising at least one heterostructure, preferably selected from a quantum well, a quantum dot, or a superlattice; and optionally at least one of said NWs comprising an electron or hole blocking layer; and optionally providing a second distributed Bragg reflector or metal mirror in contact with the top of at least a portion of said NWs.

Viewed from another aspect the invention provides process for the preparation of a device comprising providing a first distributed Bragg reflector or metal mirror in contact with a transparent spacer layer, said spacer layer being in contact with a graphitic substrate;

growing a plurality of group III-V semiconductor NWs epitaxially on said graphitic substrate opposite to said spacer layer, preferably through the holes of a hole-patterned mask on said graphitic substrate, said NWs comprising an n-type doped region and a p-type doped region optionally separated by an intrinsic region (active region); and optionally providing a second distributed Bragg reflector or metal mirror in contact with the top of at least a portion of said NWs.

Viewed from another aspect the invention provides a process for the preparation of a device comprising providing a first distributed Bragg reflector or metal mirror in contact with a transparent spacer layer, said spacer layer being in contact with a graphitic substrate;

growing a plurality of group III-V semiconductor NWs epitaxially on said graphitic substrate opposite to said spacer layer, preferably through the holes of a hole-patterned mask on said graphitic substrate, said NWs comprising at least one heterostructure, preferably selected from a quantum well, a quantum dot, or a superlattice; and optionally at least one of said NWs comprising an electron or hole blocking layer; and optionally providing a second distributed Bragg reflector or metal mirror in contact with the top of at least a portion of said NWs.

Viewed from another aspect the invention provides a process for the preparation of a device comprising providing a graphitic substrate or graphene glass, respectively;

growing a plurality of group III-V semiconductor NWs epitaxially on said graphitic substrate preferably through the holes of a hole-patterned mask on said graphitic substrate, said NWs comprising an n-type doped region and a p-type doped region optionally separated by an intrinsic region (active region); and providing a distributed Bragg reflector or metal mirror in contact with the top of at least a portion of said NWs.

Viewed from another aspect the invention provides a process for the preparation of a device as claimed in claim 17 or 18 comprising providing a graphitic substrate or graphene glass, respectively;

growing a plurality of group III-V semiconductor NWs epitaxially on said graphitic substrate preferably through the holes of a hole-patterned mask on said graphitic substrate, said NWs comprising at least one heterostructure, preferably selected from a quantum well, a quantum dot, or a superlattice; and optionally at least one of said NWs comprising an electron or hole blocking layer; and providing a distributed Bragg reflector or metal mirror in contact with the top of at least a portion of said NWs.

Viewed from another aspect the invention provides a process for the preparation of a device as claimed in claim 13 or 14 comprising growing a plurality of group III-V semiconductor NWs epitaxially on said graphitic substrate, preferably through the holes of a hole-patterned mask on said graphitic substrate, said NWs comprising at least one heterostructure, preferably selected from a quantum well, a quantum dot, or a superlattice; and optionally at least one of said NWs comprising an electron or hole blocking layer; and optionally providing a distributed Bragg reflector or metal mirror in contact with the top of at least a portion of said NWs; and transferring said graphitic substrate onto a DBR or metal mirror or onto a transparent spacer layer on a DBR or onto a transparent spacer layer on a metal mirror.

Definitions

By a group III-V compound semiconductor is meant one comprising at least one element from group III and at least one element from group V. There may be more than one element present from each group, e.g. AlGaN (i.e. a ternary compound), AlInGaN (i.e. a quaternary compound), and so on. The designation Al(In)GaN implies either AlGaN or AlInGaN, i.e. that the presence of In is optional. Any element indicated in brackets may or may not be present.

The term nanowire (NW) is used herein to describe a solid, wire-like structure of nanometer dimensions. NWs preferably have an even diameter throughout the majority of the NW, e.g. at least 75% of its length. The term NW is intended to cover the use of nanorods, nanopillars, nanocolumns or nanowhiskers some of which may have tapered end structures. The NWs can be said to be in essentially in one-dimensional form with nanometer dimensions in their width or diameter and their length typically in the range of a few 100 nm to a few µm. Ideally the NW diameter is between 50 and 500 nm. It will be appreciated that there is normally a specific diameter in order for the NW to confine a certain optical mode(s) and act as a waveguide. The specific diameter depends on the effective refractive index of the NW and the emission wavelength.

Ideally, the diameter at the base of the NW and at the top of the NW should remain about the same (e.g. within 20% of each other).

It will be appreciated that the substrate preferably carries a plurality of NWs. This may be called an array of NWs. In one embodiment however, it is envisaged that a light emitting device such as a laser device could be developed using a single NW.

Graphitic layers for substrates are films composed of single or multiple layers of graphene or its derivatives. The term graphene refers to a planar sheet of $sp^2$-bonded carbon atoms in a honeycomb crystal structure. Derivatives of graphene are those with surface modification. For example, the hydrogen atoms can be attached to the graphene surface to form graphane. Graphene with oxygen atoms attached to the surface along with carbon and hydrogen atoms is called as graphene oxide. The surface modification can be also possible by chemical doping or oxygen/hydrogen or nitrogen plasma treatment.

The term epitaxy comes from the Greek roots epi, meaning "above", and taxis, meaning "in ordered manner". The atomic arrangement of the NW is based on the crystallographic structure of the substrate. It is a term well used in this art. Epitaxial growth means herein the growth on the substrate of a NW that mimics the orientation of the substrate. It is preferred if any NW is grown epitaxially.

The NWs can be grown randomly on the graphitic substrate bottom-up using metal catalyst-assisted vapour-liquid-solid (VLS) or catalyst-free method. These methods yield huge fluctuations in the length and diameter of the NWs. More uniform NWs can be achieved by growing positioned NWs using a mask with nano-hole pattern on the substrate. The NWs nucleate in the holes of the patterned mask on the substrate. This yields uniform size and pre-defined position of the NWs. Selective area growth (SAG) is a very promising method for growing positioned catalyst-free NWs. This method is different from the metal catalyst assisted VLS method, in which metal catalyst act as nucleation sites for the growth of NWs.

The term mask refers to the mask material that is directly deposited on the graphitic layer. The mask material should ideally not absorb emitted light (which could be infrared, visible, UV-A, UV-B or UV-C). The mask should also be electrically non-conductive. The mask could contain one or more than one material, which include $Al_2O_3$, $SiO_2$, $Si_3N_4$, $TiO_2$, $W_2O_3$, and so on. Subsequently, the hole patterns in the mask material can be prepared using electron beam lithography or nanoimprint lithography and dry or wet etching.

Molecular beam epitaxy (MBE) is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure as described in detail below. Over time, and with suitable growth parameters, the incoming atoms form NWs.

Metal organic vapour phase epitaxy (MOVPE) also called as metal organic chemical vapour deposition (MOCVD) is an alternative method to MBE for forming depositions on crystalline substrates. In case of MOVPE, the deposition material is supplied in the form of metal organic precursors, which on reaching the high temperature substrate decompose leaving atoms on the substrate surface. In addition, this method requires a carrier gas (typically $H_2$ and/or $N_2$) to transport deposition materials (atoms/molecules) across the substrate surface. These atoms reacting with other atoms form an epitaxial layer on the substrate surface. Choosing the deposition parameters carefully results in the formation of NWs.

It will be appreciated that NWs of use in the devices of the invention comprise a light generating region. The light generating region may comprise an intrinsic region. Injected/excited carriers within the light generating region preferably recombine to generate light. Preferably, the light generating region comprises one or more heterostructures like a quantum well, a quantum dot, a superlattice, multiple quantum wells, or multiple quantum dots. Preferably, the quantum well(s) and the quantum dot(s) are direct bandgap quantum well(s) and direct bandgap quantum dot(s), respectively. Ideally, an intrinsic region of the light generating region may comprise one or more quantum heterostructures. The intrinsic region of a light generating region may be sandwiched between two cladding regions. One of the cladding regions may be a p-type doped region. The other cladding region may be an n-type doped region. It will be appreciated that sandwiching an intrinsic region between an n-type region and a p-type region will form a p-i-n junction within a NW.

The NW may comprise an electron or hole blocking layer, a heterojunction (e.g. a GaN/AlN heterojunction or a short-period superlattice. The hole blocking layer and/or the short-period superlattice may be within an n-type region of the NW, and a separate electron blocking layer and/or the short-period superlattice may be within a p-type region of the NW. Short-period superlattices as so-called (bandgap) "grading layers" might be needed to improve carrier transport into the light generating region and thus laser performance.

The orientation of the junction does not matter (e.g. the junction can be n-i-p or p-i-n). In most cases, it is preferred to grow the n-type doped region first followed by p-type doped region or followed by the intrinsic region and p-type doped region.

The nature of the hetero structures (e.g. quantum wells, quantum dots, superlattices, or multiple QW/QD) depends on the nature of the NW itself but will be readily determined by the person skilled in the art.

The QW(s) comprise a region of low bandgap material sandwiched between two regions of higher bandgap material. The width of the lower bandgap region is of the order of the de Broglie wavelength in size and extends between the two regions of higher bandgap material. The lower bandgap material forms potential energy discontinuities at the two heterojunctions where it meets the higher bandgap materials. The potential energy discontinuities define a one-dimensional potential well in the conduction band and/or the valance band of the QW band structure for confining carriers to the lower bandgap material. The potential well leads to the formation of one or more discrete energy levels. Carriers within the lower bandgap region may occupy a discrete energy level when confined in the potential well.

The QD(s) comprise a region of low bandgap material substantially surrounded by a region of higher bandgap material. The dimensions of the lower bandgap region are of the order of the de Broglie wavelength in size. The lower bandgap region forms potential energy discontinuities at the heterojunctions where it meets the higher bandgap materials. These potential energy discontinuities define a three-dimensional potential well in the conduction band and/or the valance band of the QD band structure. The three-dimensional potential well may confine carriers to the lower bandgap region in all three dimensions, and lead to the formation of one or more discrete energy levels. Carriers within the lower bandgap region may occupy a discrete energy level when confined in the potential well.

A distributed Bragg reflector (DBR) is a periodic structure formed from alternating dielectric or semiconductive layers that can be used to achieve nearly total reflection within a range of frequencies. It is a structure formed from multiple layers of alternating materials with varying refractive index, or by periodic variation of some characteristic (such as height) of a dielectric waveguide, resulting in periodic variation in the effective refractive index in the guide. DBRs of the invention can be dielectric (in which case the graphitic substrate becomes the charge injector) or semiconductive. The DBR may be in electrical contact with the graphitic layer or be separated therefrom by a transparent spacer layer. The term transparent is used to mean transparent with respect to the light emitted by the device.

A metal mirror is a layer of metal that reflects light, such as an Al layer.

The term resonant cavity or optical cavity is defined as the region between the two DBRs or metal mirrors, typically therefore the NW.

DETAILED DESCRIPTION OF INVENTION

This invention concerns the preparation of light emitting devices such as lasers or LEDs based on NWs grown on graphitic substrates. The NW laser of the invention is preferably a vertical cavity surface emitting laser (VCSEL) —i.e. a NW VCSEL. The structure of the NW VCSEL is described in more detail below. The NW LED of the invention is preferably a resonant cavity light emitting diode (RCLED) —i.e. a NW RCLED. The structure of the NW RCLED may be the same as the NW VCSEL but, in operation, the NW RCLED is arranged to operate below lasing threshold, rather than at or above lasing threshold. Thus, it will be appreciated that the below descriptions of the NW VCSEL, also describes the structure of the NW RCLED. It will also be appreciated that when operating below laser threshold, the NW VCSEL may be considered to be a NW RCLED. The light output from the NW RCLED will predominantly comprise spontaneous emission because it operates below laser threshold. The light output from the NW VCSEL will predominantly comprise stimulated emission when operating at or above lasing threshold.

VCSELs are semiconductor lasers, more specifically laser diodes, with a monolithic laser resonator, where the emitted light leaves the device in a direction perpendicular to the substrate surface, i.e. perpendicular to the graphitic surface. The resonator (cavity) is defined typically by two semiconductor or dielectric distributed Bragg reflectors (or metal mirrors). In the present case the top (second) DBR or metal mirror is optional but it is preferred if a second DBR or metal mirror is used.

Between those DBRs or metal mirrors, there are NWs that comprise a light generating region. The light generating region may also be referred to herein as an active region or gain medium. The NWs are typically grown to comprise a p-type doped region, an n-type doped region and, ideally, an intrinsic region, e.g. for an electrically pumped NW. The intrinsic region of a NW may form part of, or be, the light generating region of that NW.

The light generating region of each NW preferably comprises at least one heterostructure such as quantum heterostructure preferably selected from a quantum well, quantum dot or superlattice, preferably a plurality of quantum wells, quantum dots or superlattices. Preferably, the light generating region of each NW comprises a plurality of quantum hetero structures. Ideally, the light generating region comprises an intrinsic region, and the heterostructure(s) such as quantum heterostructures are within the intrinsic region.

The p-type doped region within the NW, preferably contains an electron blocking layer. Electron blocking layers of interest will be dictated by the nature of the NWs and the heterostructures within the NWs but suitable electron blocking layers include, for example, a p-type AlGaN layer included in a p-type GaN region.

In general, an electron blocking layer in the p-type region should form a barrier in the conduction band and preferably no barrier in the valence band. Oppositely, an electron blocking layer in the n-type region (also called a "hole blocking layer") should form a barrier in the valence band and preferably no barrier in the conduction band. In general, the electron blocking layer is sandwiched between lower bandgap material There may be 1 to 100 quantum wells/quantum dots in the NWs. The quantum wells/quantum dots comprise a low bandgap region arranged between higher bandgap regions. The higher bandgap regions may be considered to be barrier layers within the NWs because they provide a potential energy barrier for confining carriers to the low bandgap region. Barrier layers of interest depend in the group III V material in question.

Ideally, the whole laser device has a total thickness of a few micrometers, e.g. 1 to 10 micrometers. In use, the active region is electrically pumped with a current of few tens to hundreds of kA/cm$^2$ and generates an output power in the range from few to tens of kW/cm$^2$. The current is applied through two electrodes. In one embodiment, the graphitic substrate acts as one electrode through which current can be supplied to the NWs. In another embodiment semiconductor DBRs/metal mirrors act as one or both electrodes. The device can also be provided with an external electrode as required.

Thus, the laser device of the invention preferably comprises two distributed Bragg reflectors (DBR) or metal mirrors parallel to the graphitic surface. These mirrors define an optical cavity (or resonant cavity) comprising one or more NWs which preferably contain quantum wells/quantum dots or superlattices for the generation of light—e.g. laser light generation and LED light generation. The NWs ideally comprise a p-i-n junction and the quantum wells/quantum dots or superlattice are ideally present within the intrinsic region.

As detailed below, the planar DBR-mirrors comprise layers with alternating higher and lower refractive indices. In particular, the Bragg reflective layers within the DBR typically have a thickness of approximately equal to one quarter of the laser wavelength in the material (or certain multiples thereof, e.g. five quarters), yielding intensity reflectivities as high as 99%. High reflectivity mirrors are required in VCSELs to balance the short axial length of the gain region.

In case of semiconductor DBRs, it is preferred that the upper and lower DBRs are doped as p-type and n-type materials (or vice versa), contributing to a diode junction. If the graphitic substrate is used as a current injector, the DBR nearest the graphitic layer does not need to be conductive. The invention therefore envisages the use of dielectric DBRs.

NW VCSELs of the invention preferably comprise a light generating region that generates light having a wavelength from 200 nm to 1600 nm. For the infrared wavelength region, this can be achieved by using a light generating region comprising gallium arsenide antimonide (GaAsSb) with DBRs formed from GaAs and aluminium gallium arsenide ($Al_xGa_{1-x}As$) where x is typically 0.25 to 1.00. Thus, for example, the light generating region may comprise a quantum heterostructure (e.g. a quantum well/dot) having GaAsSb in the low bandgap region and GaAs or AlGaAs in the high bandgap regions.

AlAs is also typically used as less number of Bragg pairs are needed for a GaAs/AlAs DBR. The GaAs—Al(Ga)As system is favored for constructing DBRs in VCSELs because the lattice constant of the material does not vary strongly as the composition is changed. However, the refractive index of AlGaAs does vary relatively strongly as the Al fraction is increased, minimizing the number of layers required to form an efficient DBR compared to other candidate material systems.

For lower light wavelengths such as 200 to 400 nm, dielectric DBR or metal mirrors are preferably employed. For the visible wavelengths an Al(Ga)N/GaN DBR, dielectric DBR, or metal mirror is the preferred option.

To provide light in the UV range, the light generating regions of the NWs comprise AlGaN, preferably with an Al(Ga)N/AlGaN DBR, dielectric DBR or metal mirror.

A device according to the invention therefore preferably comprises a plurality of NWs grown epitaxially on a graphitic substrate. Each NW protrudes from a graphitic substrate and comprises a light generation region. Ideally the light generating region comprises an intrinsic region, and is arranged between a p-doped region and an n-doped region to form a p-i-n junction. Preferably, the light generating region comprises one or more quantum heterostructures (e.g. one or more quantum wells or one or more quantum dots), which are ideally arranged within the intrinsic region.

By orientating a NW laser such that its length extends out of the plane of the substrate, and by providing a means to circulate light along the length of the NW (e.g. by providing a mirror at both ends of the NW), the NW may form a NW VCSEL. Similarly, by orientating a NW LED such that its length extends out of the plane of the substrate, and by providing a means to circulate light along the length of the NW LED (e.g. by providing a mirror at both ends of the NW LED's length), the NW LED may form a NW RCLED.

Preferably, the length of a NW VCSEL, and a NW RCLED, extends substantially vertically from the horizontal plane of the substrate on which they are respectively arranged. Thus, it will be appreciated that, in general, NW VCSELs and NW RCLEDs emit light in a direction that is inclined relative to the horizontal plane of the substrate, rather than emitting light in a direction that is substantially parallel with the plane of the substrate.

For completeness, it may be that the NWs are free of heterostructures for some reason. The invention relates to devices in which the intention is that all the NWs contain the necessary heterostructures but encompasses devices in which the NWs might be free of such heterostructures. Ideally all NWs contain the necessary heterostructures.

Having a NW grown epitaxially provides homogeneity to the formed material which may enhance various end properties, e.g. mechanical, optical or electrical properties.

Epitaxial NWs may be grown from solid, gaseous or liquid precursors. Because the substrate acts as a seed crystal, the deposited NW can take on a lattice structure and/or orientation similar to those of the substrate. This is different from some other thin-film deposition methods which deposit polycrystalline or amorphous films, even on single-crystal substrates.

The III-V compound semiconductor NW may comprise a p-type doped region and an n-type doped region. The p-type doped region may be in direct contact with the n-type doped region. Preferably, however, the p-type doped region is separated from the n-type doped region by the light generating region. It will be appreciated that the arrangement of the p-type doped region, light generating region, and n-type doped region may form a double heterostructure or multiple heterostructure. The p-type doped region and the n-type doped region may be arranged to inject carriers into the light generating region. The carrier injection may occur upon application of an electric field and/or electric current to the p-type doped and the n-type doped regions. It will be appreciated that the graphitic substrate may be used to provide an electric current to the p-type doped and/or the n-type doped regions.

In embodiments wherein light generating region comprises an intrinsic region, the arrangement of the p-type doped region, intrinsic region, and n-type doped region may form a so-called p-i-n structure.

It will also be appreciated that the light generating region may be arranged to form the active region (i.e. gain medium) of a NW laser/LED.

The III-V compound semiconductor NW may additionally or alternatively comprise one or more electron hole blocking layers. The electron blocking layer(s) may be arranged adjacent to the light generating region. Preferably, one or more electron blocking layer(s) may be arranged in the p-type doped region. Additionally or alternatively, one or more electron blocking layer(s) may be arranged in the n-type doped region. Preferably, the electron blocking layer(s) in the p-type region is arranged to substantially block electron leakage from the light generating region—e.g. an electron blocking layer in the p-type region may block electron leakage from the conduction band of the light generating region, and an electron blocking layer in the n-type region may block hole leakage from the valance band of the light generating region.

The device may optionally have a second light reflecting means arranged on top of the III-V compound semiconductor NW(s). The second light reflecting means may be a DBR or a metallic layer. Optionally, the second light reflecting means may be the same as the aforementioned first light reflecting means. Preferably, however, the second light reflecting means may have a lower reflectance than the first light reflecting means. Preferably, the second light emitting means is arranged to feedback light emerging from the NW back into the NW.

It will be appreciated that arranging the NW(s) between a first and a second light reflecting means defines an optical resonator (i.e. optical cavity for circulating light). Preferably, the first and the second light reflecting means are arranged to provide optical feedback into the NW, and preferably into the light generating region. For example, the first light reflecting means may be arranged to reflect incident light from the NW back into the NW. The second light reflecting means may be arranged to reflect incident light from the NW back into the NW. Reflected light from the first light reflecting means may travel towards the second light reflecting means—and vice versa. Thus, the first and second light emitting means may be arranged to feedback light into the NW, so as to circulate light emerging from the NW. Preferably, the first and second light emitting means feedback light into the light generating region, so as to circulate light emerging from the light generating region.

Each part of the device of the invention is now described in more detail.

The advantages of the proposed NW/graphene hybrid laser/LED structure are:

1. Flexible functionality. Quantum heterostructures (i.e. low dimensional structures such as quantum wells/dots) can be much better controlled and incorporated in both the radial and axial direction in NWs, as compared to devices that are considered to have two-dimensional (2D) anisotropic geometry (e.g. ridge/rib lasers). In this way, the NWs having quantum heterostructures are able to increase the gain in their respective gain medium (i.e. light generating region).

2. Compact design. Each NW is its own laser cavity with gain medium integrated.

3. Creation of photonic crystal (PC)-effect. For example, the NWs may be arranged in an array with a pitch on the order of the emission wavelength(s) from the NWs. By tuning the array parameters (e.g. pitch) to comply with the specific diffraction conditions, the NW array can work as a PC for enhanced lasing performance.

4. Epitaxial substrate and current injector. Due to its high electric and heat conductance, graphene can be used as both epitaxial substrate for the NW growth and an efficient current injector.

5. The invention enables NWs (e.g. a NW array) to be arranged (e.g. fabricated) on any DBR (even an insulating oxide DBR made on glass) or a metal mirror.

6. Transparent contact. Since graphene is transparent to all wavelengths, the graphene can enable high light transmission from IR to deep UV, thereby minimizing absorption loss from the mirror on the substrate side.

Substrate for Nanowire Growth

The substrate used to grow NWs is a graphitic substrate, more especially it is graphene.

As used herein, the term graphene refers to a planar sheet of $sp^2$-bonded carbon atoms that are densely packed in a honeycomb (hexagonal) crystal lattice. This graphitic substrate should preferably be no more than 20 nm in thickness. Ideally, it should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate in general is 20 nm in thickness or less. Graphene sheets stack to form graphite with an interplanar spacing of 0.335 nm. The graphitic substrate preferred comprises only a few such layers and may ideally be less than 10 nm in thickness. Even more preferably, the graphitic substrate may be 5 nm or less in thickness. The area of the substrate in general is not limited. This might be as much as 0.5 $mm^2$ or more, e.g. up to 5 $mm^2$ or more such as up to 10 $cm^2$. The area of the substrate is thus only limited by practicalities.

Alternatively, the graphitic substrate could be grown on a Ni film or Cu foil by using a chemical vapour deposition (CVD) method. The substrate could be a CVD-grown graphene substrate on metallic films or foils made of e.g. Cu, Ni, or Pt.

These CVD-grown graphitic layers can be chemically exfoliated from the metal foil such as a Ni or Cu film by etching or by an electrochemical delamination method. The graphitic layers after exfoliation are then transferred and deposited to the supporting carrier for NW growth. During the exfoliation and transfer, e-beam resist or photoresist may be used to support the thin graphene layers. These supporting materials can be easily removed by acetone after deposition.

In some cases graphene glass may be preferred as a substrate (and transparent spacer layer). Graphene glass is made through direct formation of graphene over glass substrates using CVD. The use of graphene glass bypasses tedious and disruptive transfer procedures. By growing graphene directly on glass we avoid procedures where graphene is grown on metal foils and then transferred onto glass.

Whilst it is preferred if the graphitic substrate is used without modification, the surface of the graphitic substrate can be modified. For example, it can be treated with plasma of hydrogen, oxygen, nitrogen, $NO_2$ or their combinations. Oxidation of the substrate might enhance NW nucleation. It may also be preferable to pretreat the substrate, for example, to ensure purity before NW growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing NWs. A solution of $FeCl_3$, $AuCl_3$ or $GaCl_3$ could be used in a doping step.

The graphitic layers, more preferably graphene, are well known for their superior optical, electrical, thermal and mechanical properties. They are very thin but very strong, light, flexible, and impermeable. Most importantly in the present invention they are highly electrically and thermally conducting, and transparent. Compared to other transparent conductors such as ITO, ZnO/Ag/ZnO, Al doped ZnO and $TiO_2/Ag/TiO_2$ which are commercially used now, graphene has been proven to be much more transparent (e.g. even >92% transmittance in the UV spectral range from 200 to 400 nm) and conducting (<1000 Ohm$\square^{-1}$ sheet resistance for 1 nm thickness).

Support for Graphitic Substrate

The graphitic substrate may need to be supported in order to allow growth of the NWs thereon. It is also important that the device contains at least one DBR or metal mirror in order to reflect the light (e.g. laser light) generated in the device. In use therefore there must be one Bragg reflector or metal mirror typically adjacent and parallel to the graphitic substrate on a surface opposite to the growing NWs. As the graphitic layer is highly transparent, the DBR or metal mirror can still perform its function without much loss in reflection.

The DBR or metal mirror at the base of the device adjacent the graphitic layer is typically designed to completely reflect light, e.g. an essentially 100% light reflector.

A DBR or metal mirror is also preferably used at the top of the device, parallel to the graphene layer but separated therefrom by the NWs. This reflector cannot be a 100% reflector as some light is emitted in the form of the laser from the top of the device. It will be appreciated that the DBR or metal mirrors can be switched so that the light is emitted in either direction (but parallel to the NWs).

If, therefore, the DBR or metal mirror can tolerate the conditions of NW growth then conveniently, it may act as a support for the graphitic substrate during growth. Alternatively, the NWs are grown on supported graphene first and then the graphene/NWs are delaminated from the support and put on the DBR/metal mirror afterwards.

In another embodiment, there might be a transparent spacer layer (e.g. glass or fused silica) between the DBR and the graphitic substrate either for tuning of cavity length or reflectivity of the graphitic layer/spacer layer/DBR stack. The transparent spacer layer may act therefore as the support for the graphene. If a transparent spacer layer is present, there is no electrical contact between DBR and graphitic layer. In that situation it will be usual to employ a dielectric DBR and use the graphitic layer as the current injector.

Examples of preferred spacer layers include transparent layers of fused silica, fused quartz, fused alumina, sapphire, Si, SiC, GaAs, GaN or AlN. The skilled person will appreciate that the choice of spacer layer and its thickness may vary depending on the wavelength of light to be emitted by the device and the function of the spacer layer. Some layers may be transparent to one wavelength of light but not others. For example, GaAs is transparent to IR laser light. The use of graphene glass is preferred, where the graphene glass provides both graphitic substrate and spacer layer.

Preferably however the support also contains the DBR. Another advantage of using a transparent support is that it increases the size of the cavity. Increasing the size of the cavity in this way may be used to change the longitudinal mode spacing within the cavity. If the support does not contain a reflecting layer, the support can be provided with a reflecting layer to create, for example a three layer base structure of reflecting layer, support layer, graphitic layer. The support layer needs to be inert and transparent in this embodiment. The support may also be in the sequence support/mirror/graphitic layer in which case the support may not be transparent.

The term transparent is used here to mean that the support allows transmission of light, in particular the laser light.

In theory, once the NWs are grown, the support might be removed (e.g. by etching) or the graphitic substrate carrying the NWs can be peeled away from the support. It is therefore within the scope of the invention for the NWs to be grown on a supported graphitic layer, for the support to be removed by peeling the graphitic substrate with the NWs away and placed on a Bragg reflector or metal mirror in order to prepare the device of the invention.

Nanowires

In order to prepare NWs of commercial importance, it is preferred that these grow epitaxially on the substrate. It is also ideal if growth occurs perpendicular to the substrate and ideally therefore in the [0001] (for hexagonal crystal structure) direction or in the [111] direction (if cubic crystal structure).

The present inventors have determined that epitaxial growth on graphitic substrates is possible by determining a possible lattice match between the atoms in the semiconductor NW and the carbon atoms in the graphene sheet.

The carbon-carbon bond length in graphene layers is about 0.142 nm. Graphite has hexagonal crystal geometry. The present inventors have previously realised that graphite can provide a substrate on which semiconductor NWs can be grown as the lattice mismatch between the growing NW material and the graphitic substrate can be very low.

The inventors have realised that due to the hexagonal symmetry of the graphitic substrate and the hexagonal symmetry of the semiconductor atoms in the (111) planes of a nanowire growing in the [111] direction with a cubic crystal structure (or in the (0001) planes of a nanowire growing in the [0001] direction with a hexagonal crystal structure), a lattice match can be achieved between the growing nanowires and the substrate. A comprehensive explanation of the science here can be found in WO2013/104723.

Without wishing to be limited by theory, due to the hexagonal symmetry of the carbon atoms in graphitic layers, and the hexagonal symmetry of the atoms in the (111) planes of a NW growing in [111] direction with a cubic crystal structure (or in the (0001) planes of a NW growing in the [0001] crystal direction with a hexagonal crystal structure), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of NWs on graphitic substrates.

The different hexagonal arrangements of the semiconductor atoms as described in WO2013/104723, can enable semiconductor NWs of such materials to be vertically grown to form free-standing NWs on top of a thin carbon-based graphitic material.

Whilst it is ideal that there is no lattice mismatch between a growing NW and the substrate, NWs can accommodate much more lattice mismatch than thin films for example. The NWs of the invention may have a lattice mismatch of up to about 10% with the substrate and epitaxial growth is still possible. Ideally, lattice mismatches should be 7.5% or less, e.g. 5% or less.

For some semiconductors like hexagonal GaN (a=3.189 Å), hexagonal AlN (a=3.111 Å), the lattice mismatch is so small (<~2%) that excellent growth of these semiconductor NWs can be expected.

Growth of NWs can be controlled through flux ratios. The NWs grown in the present invention may be from 250 nm to several micrometers in length, e.g. up to 10 micrometers. Preferably the NWs are at least 1 micrometer in length. Where a plurality of NWs are grown, it is preferred if they all meet these dimension requirements. Ideally, at least 90% of the NWs grown on a substrate will be at least 1 micrometer in length. Preferably substantially all the NWs will be at least 1 micrometer in length.

The length of the NWs is important. Ideally these are grown so that they have a length equal to a half-integer multiple of the wavelength inside the NW of the light to be emitted by the laser device. The NWs may also be grown so that the optical cavity of each NW has a length equal to a multiple of the wavelength of the light to be emitted by the NW. The thickness of any spacer layer that may be provided may be taken into account to provide an optical cavity of desired length.

Moreover, it will be preferred if the NWs grown have the same dimensions, e.g. to within 10% of each other. Thus, at least 90% (preferably substantially all) of the NWs on a substrate will preferably be of the same diameter and/or the same length (i.e. to within 10% of the diameter/length of each other). Essentially, therefore the skilled man is looking for homogeneity and NWs that are substantially the same in terms of dimensions.

The length of the NWs is often controlled by the length of time for which the growing process runs. A longer process typically leads to a (much) longer NW.

The NWs have typically a hexagonal cross sectional shape. The NW may have a cross sectional diameter of 25 nm to several hundred nm (i.e. its thickness), e.g. 300 nm. As noted above, the diameter is ideally constant throughout the majority of the NW. NW diameter can be controlled by the manipulation of the ratio of the atoms used to make the NW as described further below.

Moreover, the length and diameter of the NWs can be affected by the temperature at which they are formed. Higher temperatures encourage high aspect ratios (i.e. longer and/or thinner NWs). The diameter can also be controlled by manipulating the nanohole opening size of the mask layer.

The skilled man is able to manipulate the growing process to design NWs of desired dimensions.

The NWs of the invention are formed from at least one III-V compound semi-conductor. Preferably, the NWs consist of group III-V compounds grown as discussed below to generate a light generating region in each NW. Preferably, the light generating regions each comprise a heterostructure. There will be more than one different group III-V compound present but it is preferred if all compounds present are group III-V compounds.

Group III element options are B, Al, Ga, In, and Tl. Preferred options here are Ga, Al and In.

Group V options are N, P, As, Sb. All are preferred, especially N.

It is of course possible to use more than one element from group III and/or more than one element from group V. Preferred compounds for NW manufacture include AlAs, GaSb, GaP, GaN, AlN, AlGaN, InGaN, AlGaInN, GaAs, GaAsSb, InP, InN, InGaAs, InSb, InAs, or AlGaAs. Compounds based on Al, Ga and In in combination with N are most preferred. The use of GaN, AlGaN, InGaN, AlInGaN or AlN is highly preferred.

It is most preferred if the NWs consist of Ga, Al, In and N (along with any doping atoms as discussed below).

Whilst the use of binary materials is possible, the use of ternary NWs in which there are two group III cations with a group V anion are preferred here, such as AlGaN. The ternary compounds may therefore be of formula XYZ wherein X is a group III element, Y is a group III different from X, and Z is a group V element. The X to Y molar ratio in XYZ is preferably 0.1 to 0.9, i.e. the formula is preferably $X_xY_{1-x}Z$ where subscript x is 0.1 to 0.9.

Quaternary systems might also be used and may be represented by the formula $A_xB_{1-x}C_yD_{1-y}$ where A and B are different group III elements and C and D are different group V elements. Again subscripts x and y are typically 0.1 to 0.9. Other options will be clear to the skilled man.

The growth of GaAs, InGaN, AlGaN and AlInGaN NWs is especially preferred. The wavelength of light emitted by a device containing these NWs can be tailored by manipulating the content of Al, In and Ga. Alternatively, the pitch and/or diameter of the NWs can be varied to change the nature of the light emitted.

Doping

The NWs of the invention comprise a light generating region (i.e. gain medium). Each gain medium can be used to generate light. When the NWs are arranged in an array, they may be optically coupled to generate light. As such, the NWs ideally need to comprise at least one heterostructure such as at least one lower bandgap section/insert, quantum well, quantum dot or superlattice. It is highly preferred if the intrinsic region of the p-i-n junction comprises at least one quantum well, quantum dot or superlattice. Devices of the invention are therefore preferably provided with an undoped intrinsic semiconductor region between a p-type semiconductor and an n-type semiconductor region.

The NWs may be optically pumped or electrically pumped to excite/inject carriers within the light generating region.

In an optically pumped device, an intrinsic region may comprise a heterostructured active gain medium. Often the gain medium may contain 10 or more, such as 20 or more periods of heterostructured active gain medium, e.g. with a thickness of 100 nm for each segment. After the growth of the active gain medium, a passivation layer (e.g. a shell layer) may be added to passivate the surface of the light generating region and/or each heterostructure for enhanced light generation.

It will be appreciated that an optically pumped device does not need to comprise doping—e.g. it does not need to comprise an n-type doped and a p-type doped region.

In an electrically pumped device, the provision of n-type doped and p-type doped regions enables carriers (i.e. electrons and/or holes) to be injected more efficiency into the light generating region (e.g. intrinsic region which may comprise a quantum heterostructure). Injected carriers, and/or excited carriers, within the light generating region may recombine (e.g. an electron-hole pair may recombine) to generate light, as mentioned previously. Due to the quantum carrier confinement effects found in quantum heterostructures, quantum heterostructures exhibit more efficient carrier recombination than bulk material such as bulk intrinsic materials. Bulk materials typically considered to have continuous energy level. In contrast, quantum heterostructures typically have at least one discrete energy state.

Doping typically involves the introduction of impurity ions into the NW, e.g. during MBE or MOVPE growth. The doping level can be controlled from $10^{15}/cm^3$ to $10^{20}/cm^3$. The NWs can be doped to provide p-type doped regions and/or n-type doped regions as desired. Doped semiconductors are extrinsic conductors.

The n(p)-type semiconductors/regions have a larger electron (hole) concentration than hole (electron) concentration by doping an intrinsic semiconductor with donor (acceptor) impurities. Suitable donor (acceptors) for III-V compounds can be Si (Mg, Be or Zn). Dopants can be introduced during the growth process or by ion implantation of the NWs after their formation.

In order to create quantum dots, quantum wells or superlattice structures within the NWs, it is generally required to form very thin semiconductor layers, often only several nanometres in size, within the NW bulk. The layers are so thin that their optical and electronic properties differ from those of thicker layers.

Thus, where a quantum heterostructure is present, the NWs of the invention are not formed from a single group III-V material. They are heterostructured and therefore comprise at least two different semiconductor compounds. By inserting thin layers of a secondary group III-V semiconductor into the bulk material composition of the NW (which preferably has a higher bandgap than the low bandgap region of the quantum heterostructures), we may create a NW with a quantum heterostructure for generating light.

In order to provide quantum confinement, the low bandgap regions (e.g. layers) of the quantum heterostructures typically need to have a size on the order of the de Broglie wavelength, as discussed previously. For example, a low bandgap layer of a quantum well heterostructure may be grown to have thickness of a few nm thick (such as 1 to 20 nm) so that the energy levels in the low bandgap layer become quantized. Quantum wells have quantum confinement in only one spatial dimension, whereas quantum dots have quantum confinement in all three spatial dimensions. A superlattice (i.e. a semiconductor superlattice) is a periodic structure of quantum confined structures (quantum wells or quantum dots) where the barrier layers are thin enough (typically a few nanometers) to allow carrier transport by tunneling to take place between the quantum wells/quantum dots. Short-period superlattices can also be applied for bandgap tailoring purposes, grading the bandgap by increasing (decreasing) the barrier-layer thickness and decreasing (increasing) the well-layer thickness along the growth direction to increase (decrease) the bandgap experienced by the charge carriers. Such grading superlattices can e.g. be used between lower bandgap material sections and higher bandgap material sections in the doped regions to improve majority carrier transport properties between the two materials of different bandgap.

A quantum dot might be formed using a thin GaAsSb layer as the low bandgap region and GaAs layers as the high bandgap region (thus, in this case, GaAs layers act as barrier regions). The NWs of the invention can be grown to have a heterostructured form radially or axially. For example, for an axial heterostructured NW, p-n junction can be axially formed by growing a p-type doped core first, and then continue with an n-type doped core (or vice versa). An intrinsic region can be positioned between doped cores for a p-i-n NW. Heterostructures or quantum heterostructures can be introduced into the intrinsic region by varying the elements fed during the growing process. For a radially heterostructured NW, p-i-n junction can be radially formed by growing the p-type doped NW core first, then an intrinsic shell and then the n-type doped semiconducting shell is grown (or vice versa). Quantum heterostructures can be introduced into the intrinsic region by varying the elements fed during the growing process.

In a p-i-n NW, when charge carriers are injected into the respective p- and n-regions, they recombine in the i-region, and this recombination generate light, as previously discussed.

In a preferred embodiment for providing UV light (e.g. laser light), the NW may comprise a p-i-n structure. The i-region could consist of $Al_xGa_{1-x}N/Al_yGa_{1-y}N$ (x>y) multiple quantum wells/quantum dots or a superlattice structure. The p-region could include/comprise an electron blocking layer (single or multiple barriers in the conduction band) to prevent the overflow of minority carriers (electrons) into the p-region. The n-region could include/comprise a hole blocking layer (single or multiple barriers in the valence band) to prevent the overflow of minority carriers (holes) into the n-region.

It is thus a preferred embodiment if the NW is provided with a quantum heterostructure (e.g. multiple quantum wells/quantum dots/superlattices). It is thus a preferred embodiment if the NW is provided with an electron blocking layer or/and a hole blocking layer.

Growth

The NWs of the invention preferably grow epitaxially. They attach to the underlying substrate through covalent, ionic or quasi van der Waals binding. Accordingly, at the junction of the substrate and the base of the NW, crystal planes are formed epitaxially within the NW. These build up, one upon another, in the same crystallographic direction thus allowing the epitaxial growth of the NW. Preferably the NWs grow vertically. The term vertically here is used to imply that the NWs grow perpendicular to the substrate. It will be appreciated that in experimental science the growth angle may not be exactly 90° but the term vertically implies that the NWs are within about 10° of vertical/perpendicular, e.g. within 5°. Because of the epitaxial growth via covalent, ionic or quasi van der Waals bonding, it is expected that there will be an intimate contact between the NWs and the graphitic substrate. To enhance the contact property further, the graphitic substrate can be doped to match the major carriers of grown NWs.

Because NWs are epitaxially grown involving physical and chemical bonding to substrates at high temperature, the bottom contact is preferably ohmic.

It will be appreciated that the substrate comprises one or more NWs, but preferably a plurality of NWs. Preferably the NWs grow about parallel to each other. It is preferred therefore if at least 90%, e.g. at least 95%, preferably substantially all NWs grow in the same direction from the same plane of the substrate.

Ideally the grown NWs are substantially parallel. Preferably, the NWs grow substantially perpendicular to the substrate.

The NWs of the invention should preferably grow in the [0001] or [111] direction for NWs with hexagonal or cubic crystal structures respectively. If the NW has a hexagonal (cubic) crystal structure, then the (0001) [111] interface between the NW and the graphitic substrate represents the surface from which axial growth takes place. The NWs are preferably grown by MBE or MOVPE. In the MBE method, the substrate is provided with a molecular beam of each reactant, e.g. a group III element and a group V element preferably supplied simultaneously. A higher degree of control of the nucleation and growth of the NWs on the graphitic substrate might be achieved with the MBE technique by using migration-enhanced epitaxy (MEE) or atomic-layer MBE (ALMBE) where e.g. the group III and V elements can be supplied alternatively.

A preferred technique in case of nitrides is plasma assisted solid-source MBE, in which very pure elements such as gallium, aluminium, and indium are heated in separate effusion cells, until they begin to slowly evaporate. The rf-plasma nitrogen source is typically used to produce low energy beams of nitrogen atoms. The gaseous elements then condense on the substrate, where they may react with each other. In the example of gallium and nitrogen, single-crystal GaN is formed. The use of the term "beam" implies that evaporated atoms (e.g. gallium) and nitrogen atoms from the plasma source do not interact with each other or vacuum chamber gases until they reach the substrate.

MBE takes place in ultra-high vacuum, with a background pressure of typically around $10^{-10}$ to $10^{-9}$ Torr. This allows NWs to grow epitaxially and maximises structural performance.

The nature of the light emitted is a function of the dimensions and geometry of the quantum heterostructures in the active region of the NW. In order to tune the various bandgaps in the quantum heterostructures in the NW, temperature and fluxes can be used. (Nanotechnology 25 (2014) 455201).

In the MOVPE method, the substrate is kept in a reactor in which the substrate is provided with a carrier gas and a metal organic gas of each reactant, e.g. a metal organic precursor containing a group III element and a metal organic precursor containing a group V element. The typical carrier gases are hydrogen, nitrogen, or a mixture of the two. A higher degree of control of the nucleation and growth of the NWs on the graphitic substrate might be achieved with the MOVPE technique by using pulsed layer growth technique, where e.g. the group III and V elements can be supplied alternatively.

Positioned Growth of Nanowires

The NWs of the invention are preferably grown positioned. This method may require a mask with nano-hole patterns deposited on the graphitic layers.

In order to prepare a more regular array of NWs with better homogeneity in height and diameter of grown NWs, the inventors envisage the use of a mask on the substrate. This mask can be provided with regular holes, where NWs can grow homogeneously in size in a regular array across the substrate. The hole patterns in the mask can be easily fabricated using conventional photo/e-beam lithography or nanoimprinting. Focussed ion beam technology may also be used in order to create a regular array of nucleation sites on the graphitic surface for the NW growth.

Thus a mask can be applied to the substrate and etched with holes exposing the substrate surface, optionally in a regular pattern. Moreover, the size and the pitch of the holes can be carefully controlled. By arranging the holes regularly, a regular pattern of NWs can be grown.

Moreover, the size of the holes can be controlled to ensure that only one NW can grow in each hole. Finally, the holes can be made of a size where the hole is sufficiently large to allow NW growth. In this way, a regular array of NWs can be grown.

By varying the size of the holes, one could control the size of the NW. It is important that the holes are suitably spaced. If the holes and hence the growing NWs are spaced by less than the wavelength of the light emitted by the laser then the NW array may act as a photonic crystal (PC). An array of 75 to 150 by 75 to 150 NWs, e.g. 100×100 NWs is a possible size. It should be noted that these numbers could vary massively depending on the design of the device.

The mask material can be any material which does not damage the underlying substrate when deposited. The mask may also be transparent to the laser light. The minimum hole size might be 50 nm, preferably at least 100-200 nm. The thickness of the mask can be 10 to 100 nm, such as 10 to 40 nm.

The mask itself can be made of an inert compound, such as silicon dioxide or silicon nitride. In particular, the hole-patterned mask comprises at least one insulating material such as $SiO_2$, $Si_3N_4$, $HfO_2$, $TiO_2$ or $Al_2O_3$ e.g. deposited by e-beam evaporation, CVD, plasma enhanced-CVD (PE-CVD), sputtering, or atomic layer deposition (ALD). The mask can therefore be provided on the substrate surface by any convenient technique such as by electron beam deposition, CVD, PE-CVD, sputtering, and ALD.

The use of a Ti mask that is either nitridated/oxidized before the NW growth, is particularly preferred as such a mask has been found to allow growth of uniform NWs (e.g. see J. Crystal Growth 311 (2009) 2063-68).

Positioned growth using hole-patterned masks yields NWs of uniform length and diameter at predefined positions. The NWs can also be grown without mask with nano-hole patterns. In such case, the NWs will have non-uniform sizes (length and diameter), and located at random positions. In one embodiment, it is preferred if no mask is used to grow the NWs of the invention. Moreover, the present inventors have found that NW density can be maximised in the absence of a mask. NW densities of at least 20 NWs per square micrometer are possible, such as at least 25 NWs per square micrometer. These very high NW densities are particularly associated with GaN, InGaN or AlGaN NWs.

For the NW growth, the graphitic substrate temperature can then be set to a temperature suitable for the growth of the NW in question. The growth temperature may be in the range 300 to 1200° C. The temperature employed is, however, specific to the nature of the material in the NW and the growth method. For GaN grown by MBE, a preferred temperature is 700 to 950° C., e.g. 750 to 900° C., such as 760° C. For AlGaN the range is slightly higher, for example 800 to 1100° C., such as 830 to 950° C., e.g. 840° C.

It will be appreciated therefore that the NWs can comprise different group III-V semiconductors within the NW, e.g. starting with a GaN stem followed by an AlGaN component or AlGaInN component and so on.

GaN NW growth in MBE can be initiated by opening the shutter of the Ga effusion cell, the nitrogen plasma cell, and the dopant cell simultaneously initiating the growth of doped GaN NWs, hereby called as stem. The length of the GaN stem can be kept between 5 nm to several 100 s of nanometers. Subsequently, one could increase the substrate temperature if needed, and open the Al shutter to initiate the growth of AlGaN NWs. One could initiate the growth of AlGaN NWs on graphitic layers without the growth of GaN stem. n- and p-type doped NWs can be obtained by opening the shutter of the n-type dopant cell and p-type dopant cell, respectively, during the NW growth. For example, Si dopant cell for n-type doping of NWs, and Mg dopant cell for p-type doping of NWs.

This process can be adapted to the growth of other group III-V NWs with suitable doping.

The temperature of the effusion cells can be used to control growth rate. Convenient growth rates, as measured during conventional planar (layer by layer) growth, are 0.05 to 2 µm per hour, e.g. 0.5 µm per hour. The pressure of the molecular beams can also be adjusted depending on the nature of the NW being grown. Suitable levels for beam equivalent pressures are between $1\times10^{-7}$ and $1\times10^{-4}$ Torr.

The beam flux ratio between reactants (e.g. group III atoms and group V molecules) can be varied, the preferred flux ratio being dependent on other growth parameters and on the nature of the NW being grown. In the case of nitrides, III-nitride NWs are always grown under nitrogen rich conditions.

It is thus an embodiment of the invention to employ a multistep, such as two step growth procedure, e.g. to separately optimize the NW nucleation and NW growth.

A significant benefit of MBE is that the growing NW can be analysed in situ, for instance by using reflection high-energy electron diffraction (RHEED). RHEED is a technique typically used to characterize the surface of crystalline materials. This technology cannot be applied so readily where NWs are formed by other techniques such as MOVPE.

A significant benefit of MOVPE is that the NWs can be grown at a much faster growth rate. This method favours the growth of radial heterostructure NWs and microwires, for example: n-type doped GaN core with shell consisting of intrinsic AlN/Al(In)GaN multiple quantum wells (MQW), AlGaN electron blocking layer (EBL), and p-type doped (Al)GaN shell. This method also allows the growth of axial heterostructured NW using techniques such as pulsed growth technique or continuous growth mode with modified growth parameters for e.g., lower V/III molar ratio and higher substrate temperature.

In more detail, the reactor must be evacuated after placing the sample, and is purged with $N_2$ to remove oxygen and water in the reactor. This is to avoid any damage to the graphene at the growth temperatures, and to avoid unwanted reactions of oxygen and water with the precursors. The total pressure is set to be between 50 and 400 Torr. After purging the reactor with $N_2$, the substrate is thermally cleaned under $H_2$ atmosphere at a substrate temperature of about 1200° C. The substrate temperature can then be set to a temperature suitable for the growth of the NW in question. The growth temperature may be in the range 700 to 1200° C. The temperature employed is, however, specific to the nature of the material in the NW. For GaN, a preferred temperature is 800 to 1150° C., e.g. 900 to 1100° C., such as 1100° C. For AlGaN the range is slightly higher, for example 900 to 1250° C., such as 1050 to 1250° C., e.g. 1250° C.

The metal organic precursors can be either trimethylgallium (TMGa) or triethylgallium (TEGa) for Ga, trimethylaluminum (TMAl) or triethylaluminum (TEAl) for Al, and trimethylindium (TMIn) or triethylindium (TEIn) for In. The precursors for dopants can be $SiH_4$ for silicon and bis(cyclopentadienyl)magnesium ($Cp_2Mg$) or bis(methylcyclopentadienyl)magnesium ($(MeCp)_2Mg$) for Mg. The flow rate of TMGa, TMAl and TMIn can be maintained between 5 and 100 sccm. The $NH_3$ flow rate can be varied between 5 and 150 sccm.

In particular, the simple use of vapour-solid growth may enable NW growth. Thus, in the context of MBE, simple application of the reactants, e.g. In and N, to the substrate without any catalyst can result in the formation of a NW. This forms a further aspect of the invention which therefore provides the direct growth of a semiconductor NW formed from the elements described above on a graphitic substrate. The term direct implies therefore the absence of a catalyst to enable growth.

Said regions can be represented by layers within a NW or shells on a core to create the NW. Thus, the invention further provides a plurality of radial group III-V NWs grown epitaxially on a graphitic substrate comprising, in this order, an n-type doped core with shell comprising an intrinsic multiple quantum well/quantum dot/superlattice, an electron blocking layer (EBL), and p-type doped shell. The n-type doped region could include/comprise a hole blocking layer (single or multiple barriers in the valence band) to prevent the overflow of minority charge carriers (holes) into the n-type doped region.

Distributed Bragg Reflector or Metal Mirror

The laser device of the invention comprises at least one, preferably two distributed Bragg reflectors (DBRs) or metal mirrors. The DBRs or metal mirrors define the resonant cavity (the NWs) and the device is defined by a highly reflective DBR mirror or metal mirror at one end, preferably a lower reflectivity DBR or metal mirror on the other end of the NWs. Ideally, the higher reflectivity DBR or metal mirror is positioned adjacent the graphitic layer.

Within the cavity, the NWs comprise a gain medium, where current is injected to produce light—e.g. laser light having a single spatial lasing mode. The DBR is designed to reflect only in a single longitudinal mode. As a result, the laser operates on a single spatial and longitudinal mode. The laser preferably emits from the exit facet opposite the highly reflective DBR or metal mirror.

DBRs are tunable over approximately a 2 nm range by changing current or temperature.

The DBR preferably comprises alternating layers of semiconductors that have different refractive indices. Each layer preferably has a thickness of a quarter of the laser wavelength in the material, yielding intensity reflectivities above 99% for the DBR. The semiconductors used are ideally group III-V semiconductors. Different refractive indexes can be achieved by varying the group III or group V atoms present in each layer.

The distributed Bragg reflector preferably comprises a plurality of semiconductor layers, preferably group III-V semiconductor layers. The semiconductor DBR must have 2 different group III-V semiconductors, e.g. GaAs and AlAs.

Adjacent layers have a different refractive index. Typically each DBR might contain 8 to 40 layers, such as 10 to 35 layers. Each layer may be 5 to 200 nm in thickness, such as 10 to 100 nm in thickness. Layers ideally reflect the refractive index of the layer in question. Thus, each layer might be 250 nm/refractive index of the layer. As typical refractive indices are around 3-4, the layer thickness may be 60 nm or so.

A preferred distributed Bragg reflector for a GaAsSb laser comprises alternate layers of GaAs and Al(Ga)As. The DBR may comprise a plurality of GaAs layers positioned between two AlAs layers. The distributed Bragg reflectors must reflect and not absorb light and hence their bandgap should be higher than that equivalent to the wavelength of light generated in the NW.

The DBR has to be tuned to the light from the NW—e.g. laser light generated in the NW. As the light is reflecting up and down the NW, the intensity is amplified. Once lasing threshold is achieved, coherent emission of light is released. Each NW will lase with a particular wavelength.

In common VCSELs, the upper and lower DBRs are doped as p-type and n-type materials, forming a diode junction. It will also be preferred if the distributed Bragg reflectors in this case are doped. The doping materials used can be those discussed above in connection with the NWs.

The DBR may also be dielectric. The DBR may comprise alternating layers of dielectric materials that have different refractive indices. The dielectric Bragg pairs could be e.g. $TiO_2$ (refractive index around 2.5) and silica (refractive index around 1.5). Other common materials in dielectric DBRs are magnesium fluoride, tantalum pentoxide (n=2.275) and zinc sulphide (n=2.32). The melting temperatures of typical dielectric materials used in DBRs are high.

As an alternative to a distributed Bragg reflector at the bottom and/or top of the device, a metallic reflective layer might be used, e.g. based on Al. High reflectivity mirrors are required in VCSELs to balance the short axial length of the gain medium.

Such a metallic layer may comprise aluminium, gold, silver, chromium, or rhodium. Preferably, the reflector is arranged to feedback light emerging from the NW back into the NW.

In one embodiment it may be possible to grow a distributed Bragg reflector within the actual NW itself.

In one embodiment, it is possible to etch the graphitic layer and distributed Bragg reflector to create islands of NWs or individual NWs on a base structure.

Filler

It is within the scope of the invention to use a filler to surround the assembly where the filler may be transparent to the emitting light. Filler may be present in the space between NWs and/or around the assembly as a whole. Different fillers might be used in the spaces between the NWs than in the assembly as a whole. The filler may comprise a semiconductor material having a higher bandgap than the materials of the NW. Alternatively the filler may comprise a polymer and/or a resin.

Device

The device of the invention might contain an array of 100 by 100 NWs. A dense array of NWs should enhance the power of the device. The NW array pitch may be tuned to act as a photonic crystal (PC) for enhanced performance. The NW diameter is ideally designed to confine a single optical mode, preferably the fundamental mode. It may emit in the UV, IR or visible spectrum, especially UV.

VCSELs in general have many applications, the most important of which are briefly discussed in the following.

Due to the short resonator round-trip time, VCSELs can be modulated with frequencies well in the gigahertz range. This makes them useful as transmitters for optical communications. Some VCSELs are used in laser computer mice since a VCSEL as light source can have a high tracking precision combined with a low electricity consumption.

Another prominent field of application is gas sensing with wavelength-tunable VCSELs. VCSELs can also be used in miniature optical clocks, where the laser beam probes an atomic transition in cesium vapor. Such clocks could become part of compact GPS devices.

Whilst the invention is described with reference to vertical cavity lasers, it is envisaged that the same device could be adapted for use as a RCLED. The device will act as an RCLED if the excitation level is below the lasing threshold. In an RCLED, spontaneous emission is generated in a multilayer Fabry-Pérot (FP) resonator, in which interference effects alter the internal angular power distribution.

In these devices, the active layer is embedded in a cavity with at least one dimension of the order of the wavelength of the emitted light. Under those circumstances, the spontaneous emission process itself is modified, such that the internal emission is no longer isotropic.

BRIEF DESCRIPTION OF THE FIGURES

FIG. 1 summarizes the fabrication process of an integrated NW/graphene/DBR laser or RCLED device. Due to the coherent coupling among DBR, NWs, and high reflectivity NW top-mirror, a NW-based vertical-cavity surface-emitting laser (VCSEL) will be demonstrated with the ultimate goal of achieving low threshold current and high light emission efficiency. Surface-emitting PC properties can also be developed by tuning the NW diameter and the pitch size between the NWs. The DBR can be made of multilayers of thin films grown by MBE (e.g. GaAs/AlAs), where crystal orientation is in general (100). Another type of DBR can be fabricated with insulating layers. However, such thin films with crystal orientation of (100) or insulating layers cannot be used for vertical NW growth. This issue can be solved by using graphene as a buffer layer. In addition, the graphene can be used as a carrier injection layer due to its high conductivity and transparency.

In FIG. 1(a) a DBR is provided onto which is placed a graphene layer (figure b). Subsequently mask layer can be applied and etched to form holes for positioned NW growth (figure c).

NWs are grown in the holes such that an n-type doped region is made first followed by the i-region and p-type doped region (figure d). A top reflective layer can then be applied such as an Al metal layer (i.e. a metal mirror). The intrinsic region may comprise a series of quantum heterostructures (e.g. quantum wells/quantum dots or a superlattice).

Optionally, the graphene layer and Bragg reflector can be etched to create individual NW lasers (f).

Figure 2A:
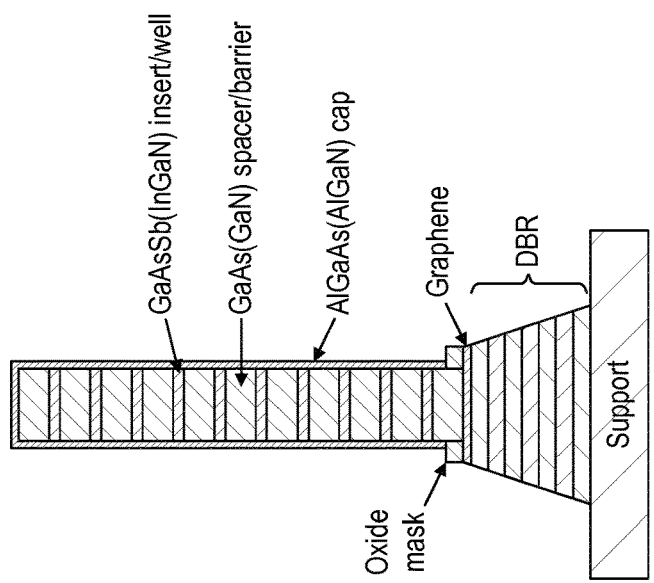
Figure 2B:
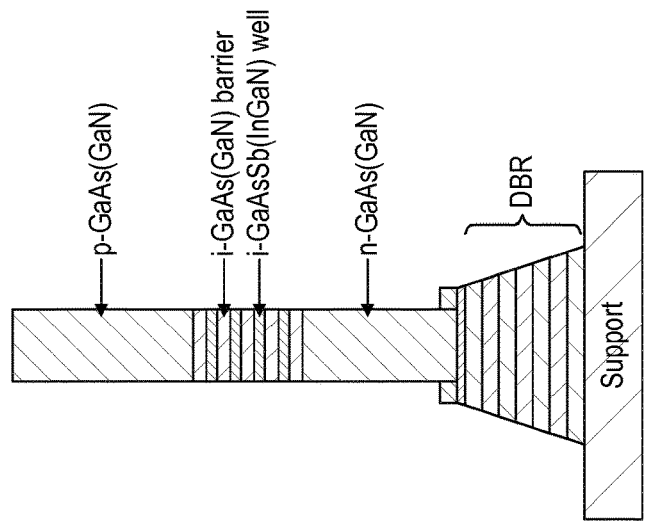
Figure 2C:
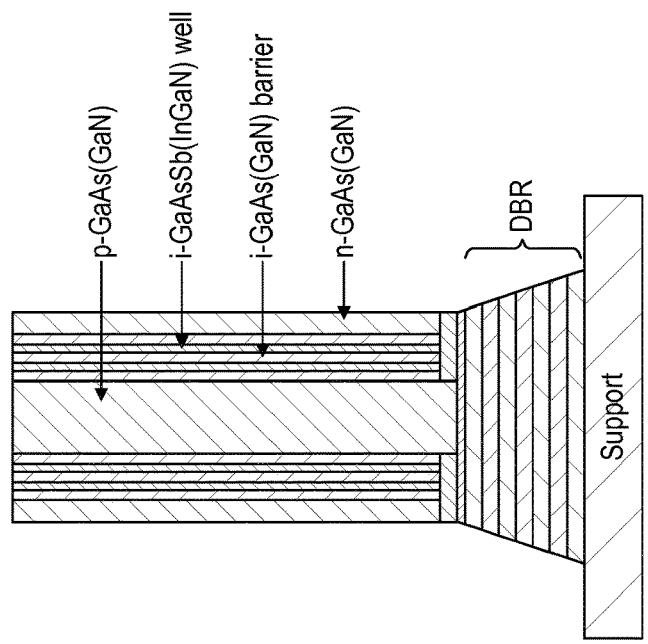

Both electrically and optically pumped NW lasers are designed with axial (FIG. 2 (a,b)) or radial heterostructures (FIG. 2(c)) of lower and higher bandgap materials to enhance the gain for lasing. A self-catalyzed vapor-liquid-solid method will be used to grow GaAs-based NW lasers on graphene, for example GaAs with InGaAs inserts/wells or GaAsSb inserts/wells, and the catalyst-free method will be used for the growth of III-N-based NW lasers on graphene, for example AlGaN NWs with GaN inserts/wells or InGaN inserts/wells. Furthermore, a high-quality DBR, for example with AlAs/GaAs or AlN/GaN Bragg pairs, will be grown by MBE or MOCVD, onto which graphene (e.g. single-layer or double-layer) will be transferred for subsequent growth of the NW laser or RCLED.

Figure 3A:
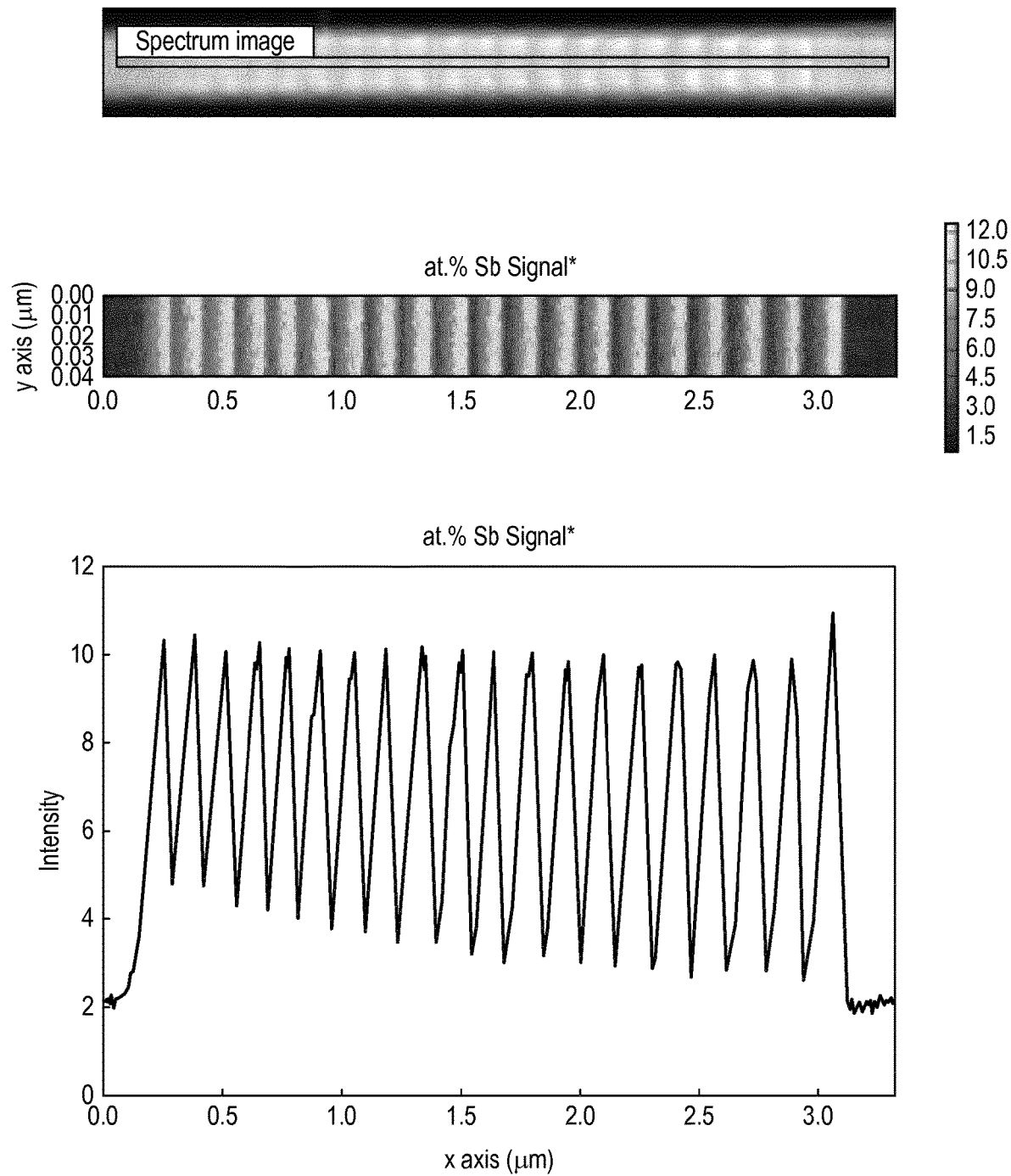
Figure 3B:
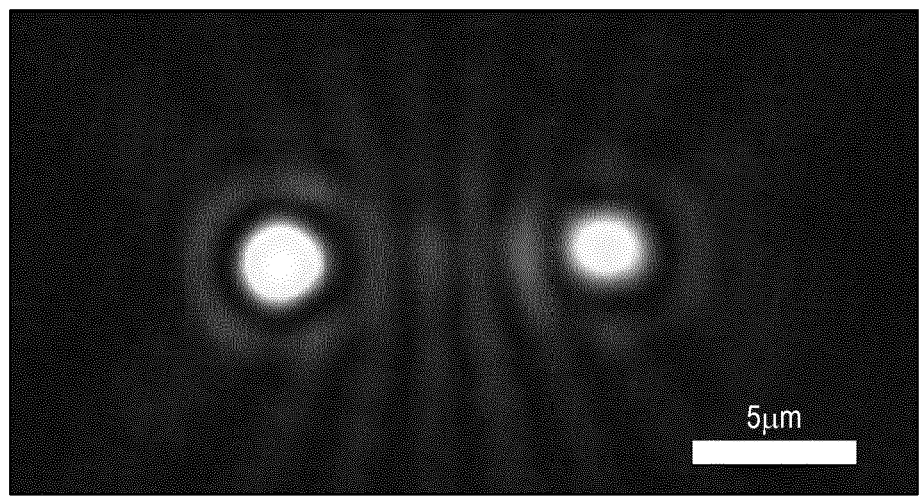
Figure 3C:
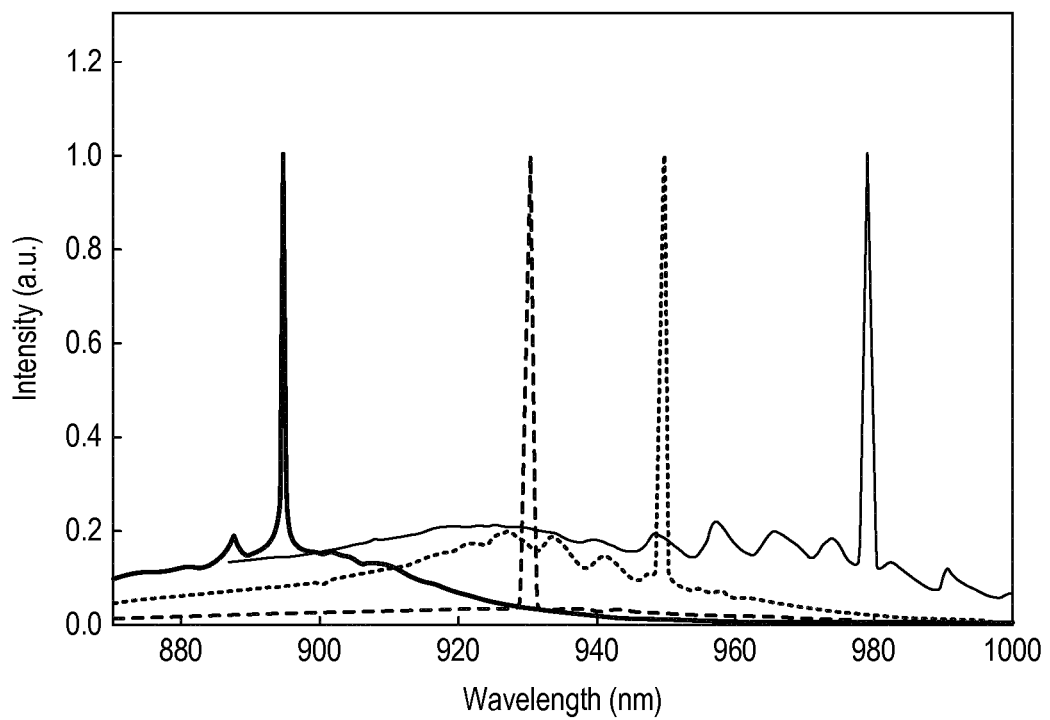

FIG. 3 describes a structure and laser spectra of a single GaAsSb/GaAs heterostructured NW laser. The NW laser consists of periodic segments of GaAsSb and GaAs. By optical pumping, the NW lases in the near-IR and causes an interference pattern as shown in FIG. 3(b). By tuning the composition and structure, the GaAsSb/GaAs heterostructured NW laser can lase covering a wide range of wavelengths as shown in FIG. 3(c).

Figure 4A:
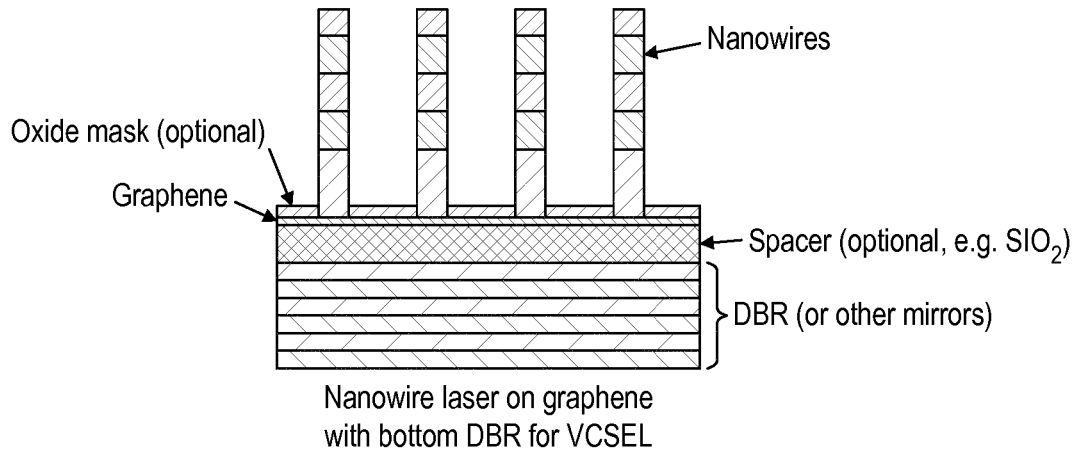

In FIG. 4(a), a bottom DBR or metal mirror is provided with a transparent intermediate layer such as a silica layer on top of which is located the graphene layer. This arrangement allows for tuning of reflectivity and/or protection (capping) of e.g. GaAs/Al(Ga)As DBR during further epitaxial growth (at high temperature) of NWs on the graphene.

Figure 4B:
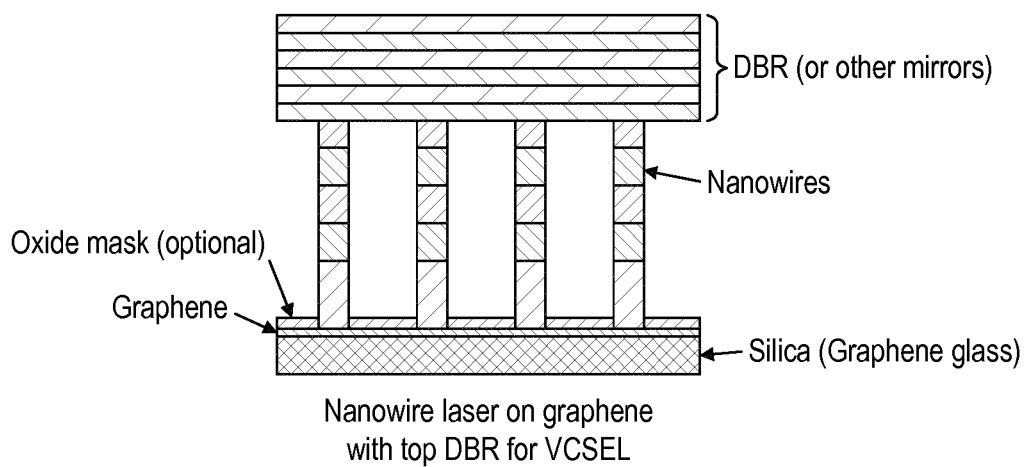

In FIG. 4(b), the DBR is located at the top of the NWs with a transparent silica, e.g. fused silica, support or other transparent support being used to carry the graphene layer. Optionally graphene glass may be used as combined substrate and support.

Figure 4C:
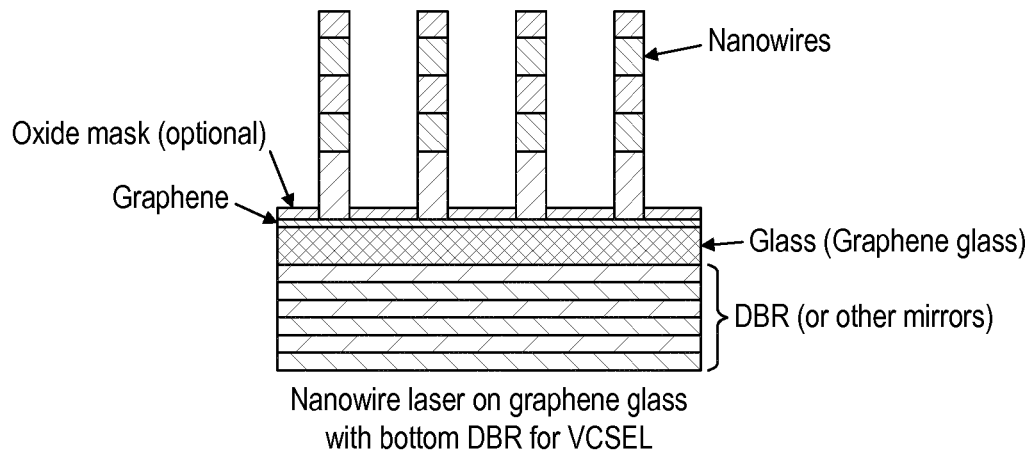

FIG. 4(c) shows an alternative option to the structure displayed in FIG. 4(a), where the graphene and the transparent intermediate layer are replaced by graphene glass which can also provide support during NW growth. Bottom DBR or metal mirror can be provided after NW growth.

Figure 4D:
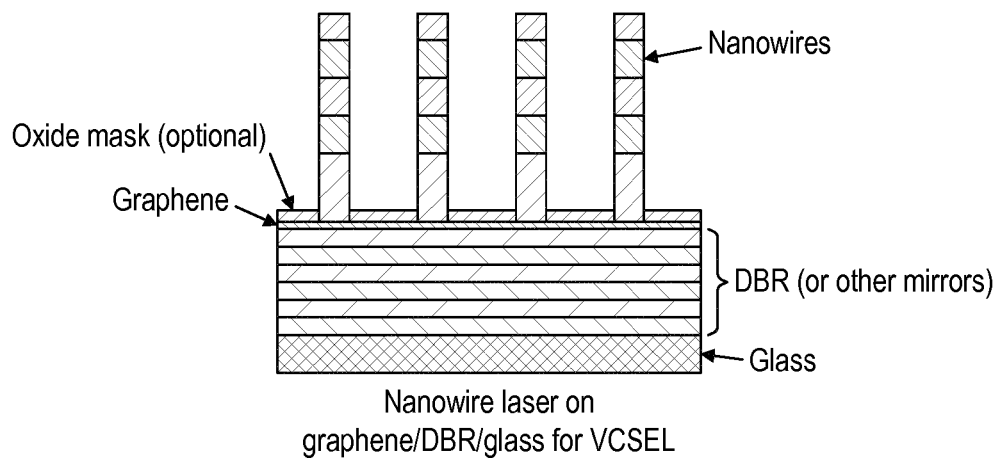

In FIG. 4(d), the glass supports the DBR.

Figure 5A:
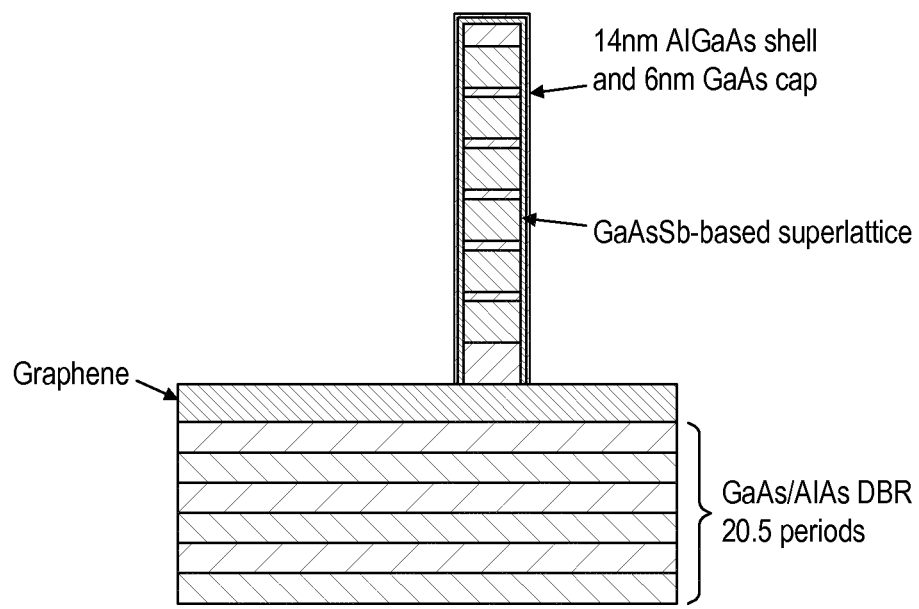
Figure 5B:
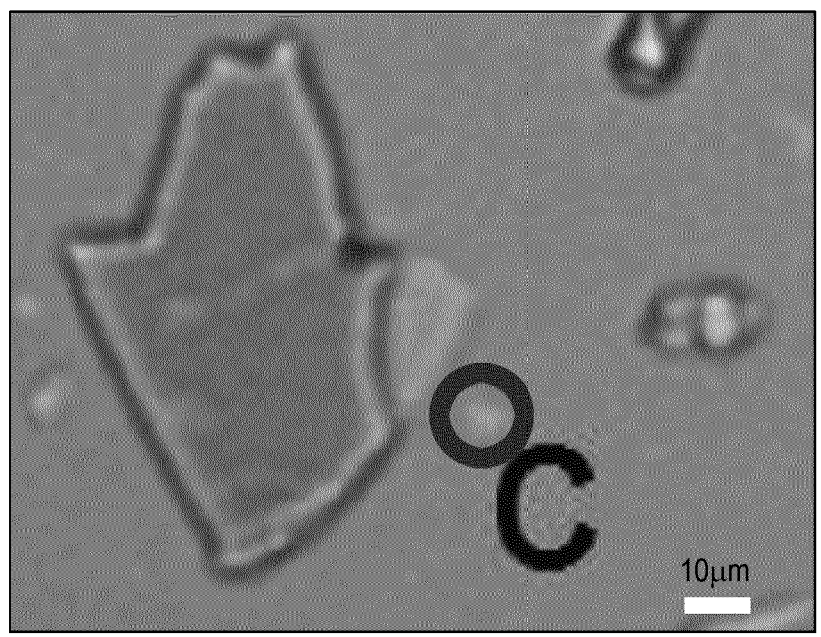
Figure 5C:
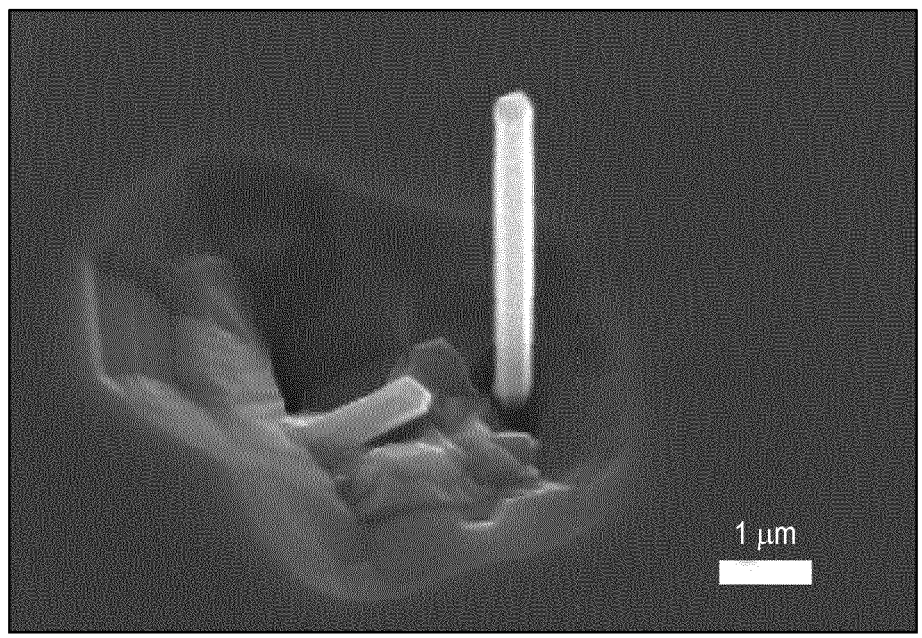

FIG. 5(a) presents the schematic of a grown NW/graphene/DBR structure. Before the NW growth, exfoliated graphene flakes were placed on top of the DBR reflector, as depicted in the optical image of FIG. 5(b). FIG. 5(c) shows a 30° tilted SEM image of a 7 μm long GaAsSb-based superlattice NW epitaxially grown perpendicular on the tiny graphene flake circled in red and marked as C in FIG. 5(b). The measured normalized reflectivity of the GaAs/AlAs DBR structure is shown as the blue curve in FIG. 5(d), which contains a high reflectivity plateau around 890 to 990 nm and reflectance fringes outside the plateau. By exerting optical excitation, photoluminescence is observed from the GaAsSb-based superlattice NW with Fabry-Pérot modes, which is marked by vertical red dashed lines. The spacing among the Fabry-Pérot modes is around 11.6 nm, which corresponds to an energy spacing of δE=16 meV around 950 nm. This correlates well to the theoretical value of 16.7 meV found for the expected TE01 mode using $n_{group}$=5.35 found from calculations based on FDTD simulations.

The NW is grown in the [111] crystal direction, and perpendicular to the graphitic surface, whereas the GaAs/AlAs DBR (thin film) is grown in the [001] crystal direction on an n-type GaAs(001) wafer.

EXAMPLE 1

Electrically Pumped AlN/AlGaN/GaN Axial Heterostructured NW Lasers (RCLEDs) on Graphene/DBR:

GaN-based NWs with AlN/AlGaN axial quantum heterostructured active gain medium are grown on a dielectric DBR (e.g. a DBR with $SiO_2$ (n=1.5) and $TiO_2$ (n=2.5) Bragg pairs) with graphene buffer. The heavily n-doped GaN NW segment is epitaxially grown directly on the graphene/DBR structure, which is followed by the growth of a heavily n-doped AlN segment, 5 periods of intrinsic AlN/AlGaN quantum heterostructured active gain medium, and a p-doped MN segment. After that, a p-doped GaN top segment is grown for top contact.

EXAMPLE 2

Optically Pumped GaAsSb/GaAs Axial Heterostructured NW Lasers on Graphene/DBR:

Intrinsic GaAs with GaAsSb/GaAs axial quantum heterostructured active gain medium are grown on a GaAs/AlAs DBR using a graphene buffer. After nucleation by using AlAsSb buffer as nucleation stem, GaAs NWs are directly epitaxially grown on the graphene/DBR structure, which is followed by the growth of 60 periods of intrinsic GaAsSb/GaAs quantum heterostructured active gain medium with a thickness of 100 nm for each segment. After the growth of the active gain medium, an AlGaAs shell with thickness of 15 nm is grown to passivate the surface for enhanced light performance.

EXAMPLE 3

NW/Graphene/DBR RCLED.

Figure 5D:
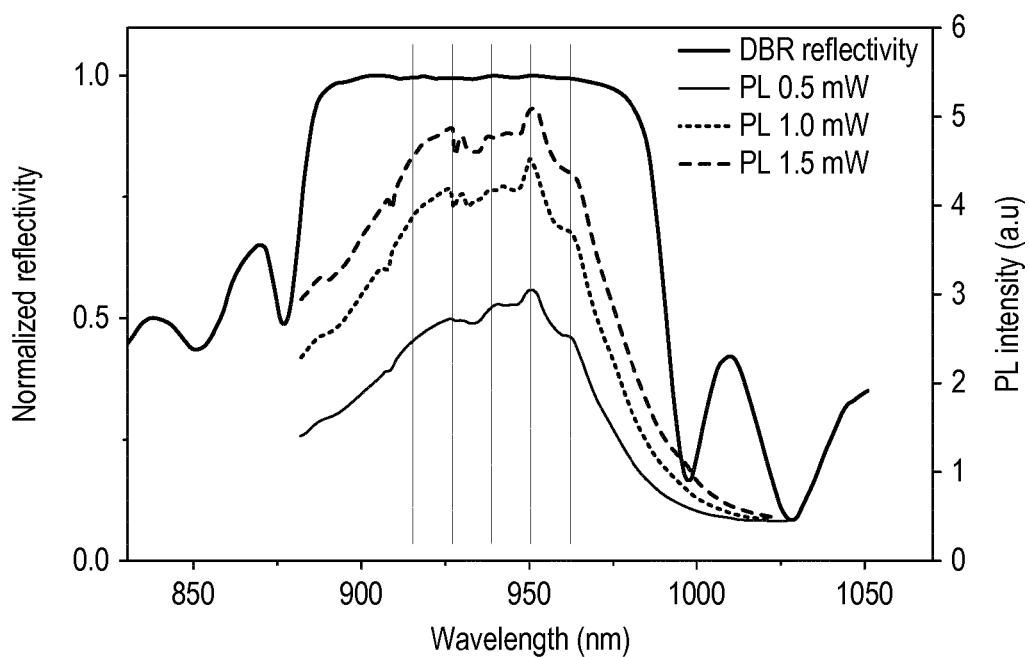

Before the NW growth, exfoliated graphene flakes were placed on top of a GaAs/AlAs DBR reflector. The GaAs/AlAs DBR (thin film) is grown in the [001] crystal direction on an n-type GaAs(001) wafer. The measured normalized reflectivity of the GaAs/AlAs DBR structure is shown in FIG. 5(d). It contains a high reflectivity plateau around 890 to 990 nm and reflectance fringes outside the plateau.

7 μm long GaAsSb-based superlattice NWs were epitaxially grown perpendicular on the graphene/DBR structure in the [111] crystal direction.

By exerting optical excitation, photoluminescence is observed from the GaAsSb-based superlattice NW with Fabry-Pérot modes, which is marked by vertical red dashed lines. The spacing among the Fabry-Pérot modes is around 11.6 nm, which corresponds to an energy spacing of δE=16 meV around 950 nm. This correlates well to the theoretical value of 16.7 meV found for the expected TE01 mode using $n_{group}$=5.35 found from calculations based on FDTD simulations.

The invention claimed is:

1. A device comprising:
a plurality of group III-V semiconductor NWs grown on one side of a graphitic substrate;
a first distributed Bragg reflector or metal mirror positioned substantially parallel to said graphitic substrate and positioned on the opposite side of said graphitic substrate to said NWs,
a second light reflector such that the NW(s) are arranged between first distributed Bragg reflector or metal mirror and the second light reflector to define an optical resonator:
and wherein said NWs comprise an n-type doped region and a p-type doped region; or
wherein said NWs comprise at least one heterostructure, and
wherein the device is a resonant cavity light emitting diode (RCLED) device or a laser device.

2. A device as claimed in claim 1 wherein at least one of said regions comprises at least one heterostructure.

3. A device as claimed in claim 2 wherein said heterostructure is a quantum heterostructure.

4. A device as claimed in claim 2 wherein said heterostructure is selected from a quantum well, a quantum dot, or a superlattice.

5. A device as claimed in claim 2, wherein at least one of said regions comprises an electron or hole blocking layer.

6. A device as claimed in claim 1 wherein said first distributed Bragg reflector or metal mirror in contact with the opposite side of said graphitic substrate.

7. A device as claimed in claim 1 wherein said n-type doped region or p-type doped region comprises at least one heterostructure.

8. A device as claimed in claim 7, wherein at least one of said regions comprises an electron or hole blocking layer.

9. A device as claimed in claim 1 wherein:
a transparent spacer layer is positioned substantially parallel to and in contact with the opposite side of said graphitic substrate; and
the first distributed Bragg reflector or metal mirror is positioned substantially parallel to and in contact with the transparent spacer layer.

10. A device as claimed in claim 9 wherein graphene glass forms said graphitic layer and transparent spacer layer.

11. A device as claimed in claim 1 wherein said NWs comprise a p-type GaN/intrinsic InGaN/n-type GaN NW structure, or a p-type Al(Ga)N/intrinsic (Al)(In)GaN/n-type Al(Ga)N NW structure.

12. A device as claimed in claim 1 wherein-said graphitic substrate is in the form of graphene glass.

13. A device as claimed in claim 1 wherein light is emitted (lased) in a direction substantially parallel to and in the same direction as the growth direction of the NWs or wherein light is emitted (lased) in a direction substantially parallel to and in the opposite direction as the growth direction of the NW.

14. A device as claimed in claim 1 wherein the distributed Bragg reflector comprises alternating layers of different group III-V semiconductors; or wherein the distributed Bragg reflector comprises alternating layers of dielectric material(s).

15. A device as claimed in any preceding claim wherein said NWs comprise Ga, in or Al;
wherein said NWs comprise As, Sb, P or N;
wherein said NWs comprise Ga and/or In and/or Al together with As and/or Sb and/or P; or
wherein said NWs comprise Ga and/or In and/or Al together with N.

16. A device as claimed in claim 1, wherein the plurality of group III-V semiconductor NWs are grown through the holes of a hole-patterned mask on said graphitic substrate.

17. A device as claimed in claim 1, wherein said second light distributor is a distributed Bragg reflector or metal mirror in contact with the top of at least a portion of said NWs.

18. A device as claimed in claim 1, wherein said NWs comprise an intrinsic region between said n-type doped region and said p-type doped region.

19. A device as claimed in claim 18 wherein said intrinsic region comprises at least one heterostructure; preferably at least one quantum heterostructure.

20. A device as claimed in claim 19, wherein at least one of said regions comprises an electron or hole blocking layer.

21. A device as claimed in claim 18 wherein said intrinsic region comprises a heterostructure consisting of ions of Al and/or Ga and/or In with Sb and/or As, and/or N.

22. A device as claimed in claim 1, wherein said NW(s) comprise a light generating region.

* * * * *